United States Patent
Badaye et al.

(10) Patent No.: US 9,952,737 B2
(45) Date of Patent: Apr. 24, 2018

(54) SINGLE LAYER TOUCH SENSOR

(75) Inventors: Massoud Badaye, Sunnyvale, CA (US);
Peter Vavaroutsos, San Jose, CA (US);
John Carey, San Jose, CA (US)

(73) Assignee: PARADE TECHNOLOGIES, LTD., Santa Clara, CA (US)

( * ) Notice: Subject to any disclaimer, the term of this patent is extended or adjusted under 35 U.S.C. 154(b) by 42 days.

(21) Appl. No.: 13/405,071

(22) Filed: Feb. 24, 2012

(65) Prior Publication Data

US 2012/0227259 A1    Sep. 13, 2012

Related U.S. Application Data

(60) Provisional application No. 61/446,178, filed on Feb. 24, 2011, provisional application No. 61/559,590, filed on Nov. 14, 2011.

(51) Int. Cl.
*G06F 3/041*    (2006.01)
*G06F 3/047*    (2006.01)
(Continued)

(52) U.S. Cl.
CPC .............. *G06F 3/047* (2013.01); *G06F 3/044* (2013.01); *G09G 3/3611* (2013.01);
(Continued)

(58) Field of Classification Search
CPC ........ G06F 3/041; G06F 3/0418; G06F 3/044; G06F 3/047; G06F 2203/04107;
(Continued)

(56) References Cited

U.S. PATENT DOCUMENTS

| 4,233,522 A | 11/1980 | Grummer et al. |
| 4,686,332 A * | 8/1987 | Greanias ................. G06F 3/044 345/173 |

(Continued)

FOREIGN PATENT DOCUMENTS

| CN | 101093333 A | 12/2007 |
| CN | 201540548 U | 8/2010 |

(Continued)

OTHER PUBLICATIONS

U.S. Appl. No. 13/248,776, "Single Layer Touch Sensor," Massoud Badaye, filed Sep. 29, 2011, 36 pgs.
(Continued)

*Primary Examiner* — Roberto Flores
(74) *Attorney, Agent, or Firm* — Morgan, Lewis & Bockius LLP

(57) ABSTRACT

Embodiments described herein provide capacitance sensing devices and methods for forming such devices. The capacitance sensing devices include a substrate having a central and an outer portion. A plurality of substantially co-planar electrodes are on the central portion substrate. A first plurality of conductors are on the substrate. Each of the first plurality of conductors has a first end portion electrically connected to one of the plurality of electrodes and a second end portion on the outer portion of the substrate. An insulating material is coupled to the second end portions of the first plurality of conductors. A second plurality of conductors are coupled to the insulating material. Each of the second plurality of conductors is electrically connected to the second end portion of at least some of the first plurality of conductors and is insulated from the second end portion of the others of the first plurality of conductors.

12 Claims, 22 Drawing Sheets

(51) Int. Cl.
*G06F 3/044* (2006.01)
*H03K 17/96* (2006.01)
*G09G 3/36* (2006.01)

(52) U.S. Cl.
CPC ... *H03K 17/962* (2013.01); *G09G 2300/0426* (2013.01); *H03K 17/9622* (2013.01); *H03K 2017/9602* (2013.01); *Y10T 29/49105* (2015.01); *Y10T 29/49124* (2015.01); *Y10T 29/49155* (2015.01)

(58) Field of Classification Search
CPC . G06F 2203/04112; G06F 2203/04113; H03K 2017/9602
USPC ............... 345/156–173; 178/18.01–20.04
See application file for complete search history.

(56) References Cited

U.S. PATENT DOCUMENTS

| | | | |
|---|---|---|---|
| 4,707,845 A | 11/1987 | Krein et al. | |
| 5,834,845 A * | 11/1998 | Stolmeijer | H01L 21/768 257/752 |
| 7,129,935 B2 * | 10/2006 | Mackey | 345/174 |
| 7,202,855 B2 | 4/2007 | Shigetaka et al. | |
| 7,202,859 B1 * | 4/2007 | Speck et al. | 345/174 |
| 7,265,809 B2 | 9/2007 | Dunn et al. | |
| 7,280,173 B2 | 10/2007 | Kamijo | |
| 7,382,139 B2 * | 6/2008 | Mackey | 324/660 |
| 7,423,635 B2 * | 9/2008 | Taylor et al. | 345/174 |
| 7,439,962 B2 * | 10/2008 | Reynolds et al. | 345/173 |
| 7,499,039 B2 | 3/2009 | Roberts | |
| 7,548,073 B2 | 6/2009 | Mackey et al. | |
| 7,821,425 B2 | 10/2010 | Philipp | |
| 7,875,814 B2 * | 1/2011 | Chen | G06F 3/046 178/18.01 |
| 7,973,771 B2 * | 7/2011 | Geaghan | 345/173 |
| 8,243,027 B2 * | 8/2012 | Hotelling et al. | 345/173 |
| 8,274,488 B2 | 9/2012 | Bae | |
| 8,294,687 B1 | 10/2012 | Ksondzyk | |
| 8,300,019 B2 | 10/2012 | Elias et al. | |
| 8,497,786 B2 * | 7/2013 | Camacho | G06F 1/1626 341/33 |
| 8,508,680 B2 | 8/2013 | Geaghan et al. | |
| 8,599,150 B2 | 12/2013 | Philpp | |
| 8,866,490 B1 | 10/2014 | Mandziy et al. | |
| 8,866,491 B2 | 10/2014 | Ksondzyk et al. | |
| 9,256,327 B2 | 2/2016 | Salaverry et al. | |
| 2003/0210235 A1 | 11/2003 | Roberts | |
| 2004/0175257 A1 * | 9/2004 | Pallas | 414/222.02 |
| 2004/0239650 A1 | 12/2004 | Mackey | |
| 2005/0270039 A1 | 12/2005 | Mackey | |
| 2005/0270273 A1 * | 12/2005 | Marten | 345/173 |
| 2006/0097991 A1 | 5/2006 | Hotelling et al. | |
| 2006/0227115 A1 | 10/2006 | Fry | |
| 2007/0008299 A1 * | 1/2007 | Hristov | 345/173 |
| 2007/0074913 A1 | 4/2007 | Geaghan et al. | |
| 2007/0074914 A1 * | 4/2007 | Geaghan et al. | 178/18.06 |
| 2007/0132386 A1 | 6/2007 | Kim et al. | |
| 2007/0257894 A1 * | 11/2007 | Philipp | G06F 3/044 345/173 |
| 2007/0279395 A1 | 12/2007 | Philipp et al. | |
| 2008/0143683 A1 * | 6/2008 | Hotelling | 345/173 |
| 2008/0158181 A1 * | 7/2008 | Hamblin et al. | 345/173 |
| 2008/0238433 A1 * | 10/2008 | Joutsenoja | G01R 19/145 324/457 |
| 2008/0246496 A1 * | 10/2008 | Hristov et al. | 324/686 |
| 2008/0264699 A1 * | 10/2008 | Chang et al. | 178/18.01 |
| 2009/0002337 A1 | 1/2009 | Chang | |
| 2009/0090694 A1 * | 4/2009 | Hotelling et al. | 216/41 |
| 2009/0159344 A1 * | 6/2009 | Hotelling et al. | 178/18.06 |
| 2009/0273577 A1 | 11/2009 | Chen et al. | |
| 2009/0314621 A1 | 12/2009 | Hotelling | |
| 2010/0013800 A1 | 1/2010 | Elias et al. | |
| 2010/0045614 A1 | 2/2010 | Gray et al. | |
| 2010/0059294 A1 | 3/2010 | Elias et al. | |
| 2010/0079401 A1 | 4/2010 | Staton | |
| 2010/0090979 A1 * | 4/2010 | Bae | 345/174 |
| 2010/0108409 A1 * | 5/2010 | Tanaka et al. | 178/18.06 |
| 2010/0144391 A1 * | 6/2010 | Chang et al. | 455/566 |
| 2010/0163394 A1 | 7/2010 | Tang et al. | |
| 2010/0214260 A1 * | 8/2010 | Tanaka et al. | 345/174 |
| 2010/0220071 A1 | 9/2010 | Nishihara et al. | |
| 2010/0253646 A1 * | 10/2010 | Hiratsuka | G06F 3/044 345/174 |
| 2010/0258360 A1 * | 10/2010 | Yilmaz | 178/18.06 |
| 2010/0289774 A1 * | 11/2010 | Pan et al. | 345/175 |
| 2010/0321326 A1 * | 12/2010 | Grunthaner | G06F 3/044 345/174 |
| 2010/0321331 A1 | 12/2010 | Oda et al. | |
| 2010/0328254 A1 * | 12/2010 | Niga | G06F 3/044 345/174 |
| 2011/0012845 A1 | 1/2011 | Rothkopf et al. | |
| 2011/0018841 A1 | 1/2011 | Hristov | |
| 2011/0048812 A1 | 3/2011 | Yilmaz | |
| 2011/0048813 A1 * | 3/2011 | Yilmaz | 178/18.06 |
| 2011/0102361 A1 | 5/2011 | Philipp | |
| 2011/0134070 A1 * | 6/2011 | Wang | G06F 3/041 345/174 |
| 2011/0134075 A1 | 6/2011 | Takusa | |
| 2011/0148785 A1 | 6/2011 | Oda et al. | |
| 2011/0170099 A1 | 7/2011 | Ko | |
| 2011/0267308 A1 * | 11/2011 | Park | G06F 3/044 345/174 |
| 2012/0050180 A1 | 3/2012 | King et al. | |
| 2012/0081324 A1 | 4/2012 | Philipp | |
| 2012/0098783 A1 | 4/2012 | Badaye et al. | |
| 2012/0162090 A1 | 6/2012 | Chang et al. | |
| 2012/0162144 A1 | 6/2012 | Faahraeus et al. | |
| 2012/0182251 A1 | 7/2012 | Krah | |
| 2012/0200530 A1 | 8/2012 | Wu et al. | |
| 2012/0255167 A1 | 10/2012 | Badaye et al. | |
| 2012/0256851 A1 | 10/2012 | Wang et al. | |
| 2012/0262412 A1 | 10/2012 | Guard et al. | |
| 2013/0021296 A1 * | 1/2013 | Min | G06F 3/044 345/174 |
| 2013/0050105 A1 | 2/2013 | Lee et al. | |
| 2013/0069905 A1 | 3/2013 | Krah et al. | |
| 2013/0100054 A1 | 4/2013 | Philipp | |
| 2013/0127772 A1 | 5/2013 | Guard et al. | |
| 2013/0127775 A1 | 5/2013 | Yilmaz et al. | |
| 2013/0181943 A1 | 7/2013 | Bulea et al. | |
| 2013/0187704 A1 | 7/2013 | Edwards | |
| 2013/0207911 A1 | 8/2013 | Barton et al. | |
| 2013/0234974 A1 | 9/2013 | Guard | |
| 2013/0329347 A1 | 12/2013 | Kuo et al. | |
| 2014/0092036 A1 | 4/2014 | Lin et al. | |
| 2014/0192027 A1 | 7/2014 | Ksondzyk et al. | |
| 2014/0210784 A1 | 7/2014 | Gourevitch et al. | |

FOREIGN PATENT DOCUMENTS

| | | | | |
|---|---|---|---|---|
| CN | 102541334 A | 7/2012 | | |
| JP | 2010205177 A | 9/2010 | | |
| WO | WO 2010/016174 A1 | 2/2010 | | |
| WO | WO2010/117882 A2 | 10/2010 | | |
| WO | WO 2011122782 A2 * | 10/2011 | | G06F 3/044 |
| WO | WO2012/176639 A1 | 12/2012 | | |
| WO | WO2013/179042 A2 | 12/2013 | | |

OTHER PUBLICATIONS

U.S. Appl. No. 13/800,468, "Method and Apparatus for Eliminating Tail Effect in Touch Applications," Vasyl Mandziy, filed Mar. 13, 2013, 51 pgs.

U.S. Appl. No. 61/446,178, "Single-Layer Multi-Touch Sensor," Matt Badaye, filed Feb. 24, 2011, 6 pgs.

U.S. Appl. No. 61/559,590, "Single Layer Touch Sensor," Massoud Badaye, filed Nov. 14, 2011, 35 pgs.

U.S. Appl. No. 61/607,513, "Single Layer Multi-Touch Sensor," Matt Badaye, filed Mar. 6, 2012, 11 pgs.

(56) References Cited

OTHER PUBLICATIONS

Application Number PCT/US2011/053916, "Single Layer Touch Sensor," filed Sep. 29, 2011, 35 pgs.
Badaye, Office Action, U.S. Appl. No. 13/528,739, filed Apr. 29, 2015, 19 pgs.
Badaye, Final Office Action, U.S. Appl. No. 13/528,739, filed Dec. 15, 2015, 19 pgs.
Fischer, Dirk, "Capacitive Touch Sensors: Application Fields, Technology Overview and Implementation Example," Fujitsu Microelectronics Europe, Langen, Germany V4, dated Jan. 12, 2010, 12 pgs.
Gourevitch, Office Action, U.S. Appl. No. 14/229,524, dated Jul. 29, 2014, 15 pgs.
Gourevitch, Notice of Allowance, U.S. Appl. No. 14/229,524, dated Oct. 23, 2014, 16 pgs.
Gourevitch, Office Action, U.S. Appl. No. 14/229,524, dated May 28, 2015, 16 pgs.
Gourevitch, Final Office Action, U.S. Appl. No. 14/229,524, dated Jan. 14, 2016, 16 pgs.
International Search Report and Written Opinion, PCT/US2011/053916, dated Apr. 10, 2012, 6 pgs.
International Search Report and Written Opinion, PCT/US2012/026634, dated May 29, 2012, 7 pgs.
International Search Report and Written Opinion, PCT/US2013/062331, dated Feb. 12, 2014, 6 pgs.
USPTO, Office Action, U.S. Appl. No. 13/528,644, dated Nov. 20, 2012, 6 pgs.
USPTO, Notice of Allowance, U.S. Appl. No. 13/528,644, dated Jan. 25, 2013, 5 pgs.
USPTO, Notice of Allowance, U.S. Appl. No. 13/528,644, dated Apr. 23, 2013, 6 pgs.
USPTO, Notice of Allowance, U.S. Appl. No. 13/528,644, dated Jun. 7, 2013, 6 pgs.
USPTO, Final Office Action, U.S. Appl. No. 13/800,468, dated May 22, 2014, 10 pgs.
USPTO, Office Action, U.S. Appl. No. 13/800,468, dated Jan. 21, 2014, 8 pgs.
USPTO, Notice of Allowance, U.S. Appl. No. 13/800,468, dated Sep. 12, 2014, 8 pgs.
USPTO, Final Office Action, U.S. Appl. No. 14/038,423, dated May 22, 2014, 11 pgs.
USPTO, Office Action, U.S. Appl. No. 14/038,423, dated Jan. 14, 2014, 9 pgs.
USPTO, Notice of Allowance, U.S. Appl. No. 14/038,423, dated Sep. 9, 2014, 9 pgs.
Wu, Xialong et al., "Touchware: A Software-Based Technique for High-Resolution Multi-Touch Sensing Devices," Int. J. Ad Hoc and Ubiquitous Computing, vol. 17 No. 1, 2014, 13 pgs.
Kravets, Office Action, U.S. Appl. No. 14/318,354, dated Sep. 9, 2014, 18 pgs.
Kravets, Final Office Action, U.S. Appl. No. 14/318,354, dated Dec. 26, 2014, 19 pgs.
Kravets, Office Action, U.S. Appl. No. 14/318,354, dated Jun. 10, 2015, 19 pgs.
Kravets, Final Office Action, U.S. Appl. No. 14/318,354, dated Dec. 15, 2015, 21 pgs.
Kravets, Notice of Allowance, U.S. Appl. No. 14/318,354, dated Mar. 16, 2016, 10 pgs.
International Search Report and Written Opinion, PCT/US2014/051363, dated Dec. 18, 2014, 9 pgs.
Ksondzyk, Office Action U.S. Appl. No. 14/514,654, dated Jun. 14, 2015, 10 pgs.
Gourevitch, Office Action, U.S. Appl. No. 14/229,524, dated Sep. 26, 2016, 15 pgs.
Ksondzyk, Notice of Allowance, U.S. Appl. No. 14/514,654, dated Sep. 28, 2016, 5 pgs.
Prendergast, Final Office Action, U.S. Appl. No. 14/666,764, dated Aug. 16, 2016, 18 Pgs.
Gourevitch, Final Office Action, U.S. Appl. No. 14/229,524, dated Feb. 14, 2017, 17 pgs.
Parade Technologies Ltd., Office Action, CN201380064976.9, dated Mar. 13, 2017, 8 pgs.
Prendergast, Office Action, U.S. Appl. No. 14/666,764, dated Apr. 15, 2016, 14 pgs.

\* cited by examiner

SINGLE LAYER TOUCH SENSOR

RELATED APPLICATION

This application claims the priority benefits of U.S. Provisional Application No. 61/446,178, filed Feb. 24, 2011, and U.S. Provisional Application No. 61/559,590, filed Nov. 14, 2011, both of which are incorporated herein in their entirety.

TECHNICAL FIELD

This disclosure relates to the field of touch sensors and, in particular, to capacitive sensors.

BACKGROUND

In recent years, touch pads, or capacitive sensor devices, have become increasing integrated in various industries and product lines. Often, these sensors have the ability to detect multiple objects (e.g., fingers) simultaneously.

Touch sensors are an expensive part of the user interface system. One reason for the high cost of touch sensors is that conventional sensors use either multiple layers of materials formed on multiple substrates or a single substrate with a series of "jumpers" to form electrical connection between the individual electrode segments and insulate them from the other electrodes that intersect them.

BRIEF DESCRIPTION OF THE DRAWINGS

The present disclosure is illustrated by way of example, and not by way of limitation, in the figures of the accompanying drawings.

DETAILED DESCRIPTION

Figure 1:
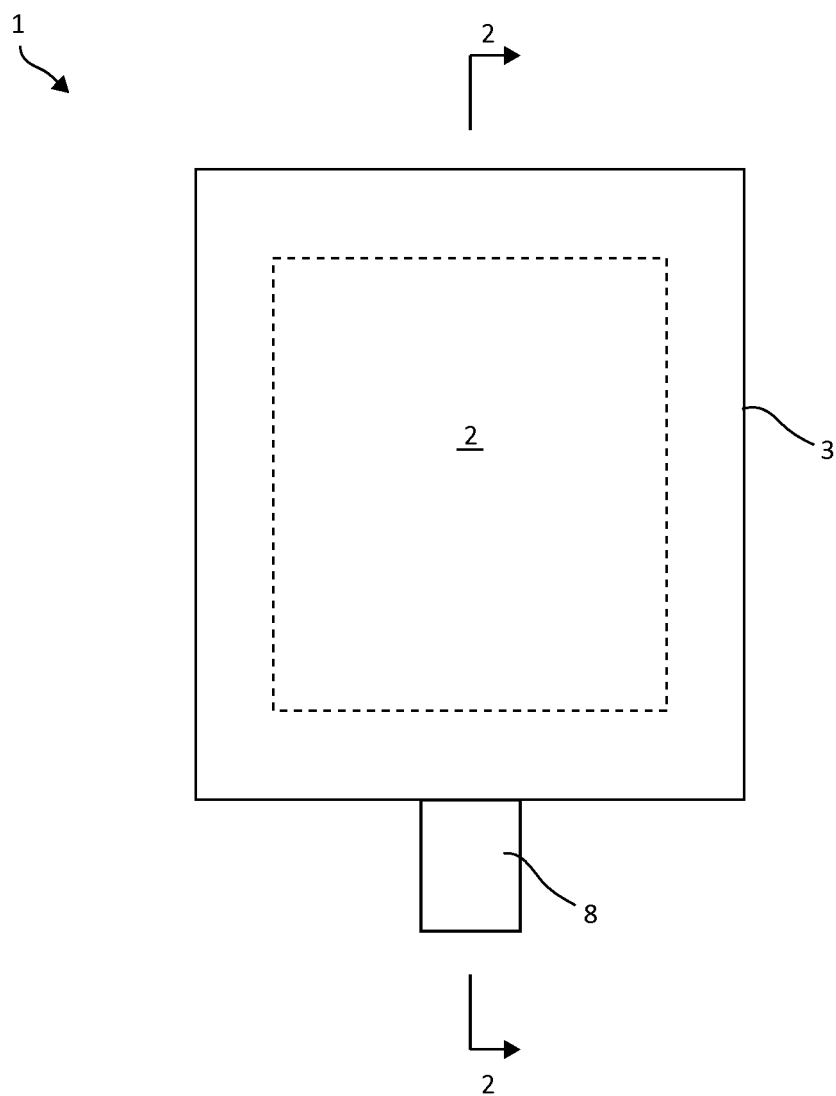
FIG. 1 is a simplified plan view of a touch sensor device according to one embodiment.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

In the following detailed description, for purposes of explanation, numerous specific details are set forth in order to provide a thorough understanding of the subject matter of the present application. It will be evident, however, to one skilled in the art that the disclosed embodiments, the claimed subject matter, and their equivalents may be practiced without these specific details.

The detailed description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Attempts have been made in the past to reduce the number of layers, and thus the manufacturing costs, of touch sensors. There are several single layer sensors available that are suited only for single touch reception. These sensors typically use a series of electrodes the width of which linearly change from one end to the other end of the electrode. Using the signal variation along the electrode's length, the coordinate along the electrode's axis is determined. The coordinate in the perpendicular direction to the electrodes axis is determined by the conventional digitization method.

Another possibility for a single layer multiple-touch sensor uses an array of pads filling the sensor area, and sensing each of the pads (or electrodes) individually in a self capacitance sensing mode. However, such requires independent traces for each of the sensing pads and a very large number of measuring channels and pins on the controller chip to get an acceptable accuracy for even a small size sensor.

Embodiments of the present invention allow for addressing the sensing pads without requiring an impractically large number of measuring ports or pins on the controller. Additionally, a method of achieving multi-touch sensors with no bezel is disclosed herein, and the performance of such sensors is demonstrated.

Embodiments described herein provide a touch sensor device and a method for forming a touch sensor device that has a single layer active area. Additionally, the touch sensor device is provided with a wiring scheme that minimizes the number of wires, as well as the layers, (or traces) required to simultaneously detect multiple contact points (i.e., "touches"). As a result, overall manufacturing costs may be reduced.

Figure 2:
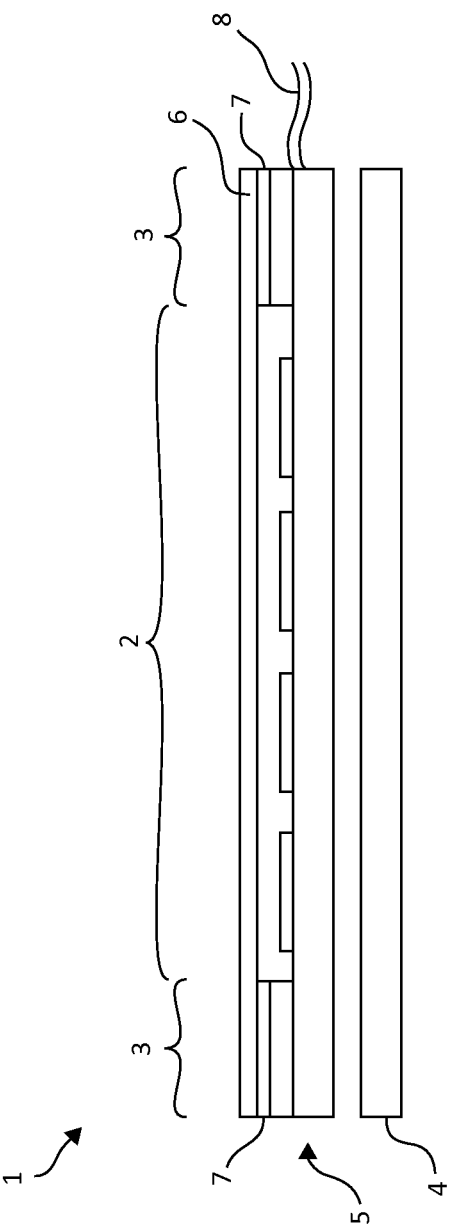
FIG. 2 is a simplified cross-sectional view of the touch sensor device of FIG. 1 taken along line 2-2.

FIGS. 1 and 2 are simplified views of a touch sensor device, or capacitance sensing device, 1 according to one embodiment. In one embodiment, the touch sensor device 1 is a "touchscreen" device that has a visible area (or portion) 2 and a non-visible area 3. The touch sensor device 1 includes a liquid crystal display (LCD) panel 4 arranged below a touch sensor array (or assembly) 5. As is commonly understood, the visible area 2 may correspond to the size and shape of a transparent region of the touch sensor array 5, while the non-visible area may correspond to a non-transparent region of the touch sensor array 5 which may be covered by a casing (not shown). The touch sensor array 5 includes an overlay (or protective layer) 6 attached to a side thereof opposite the LCD panel by an adhesive 7. The touch sensor device 1 also includes a flexible printed circuit (FPC) tail 8 extending therefrom, which as described below may be used to route electrical signals to and from the touch sensor array 10.

Figure 3:
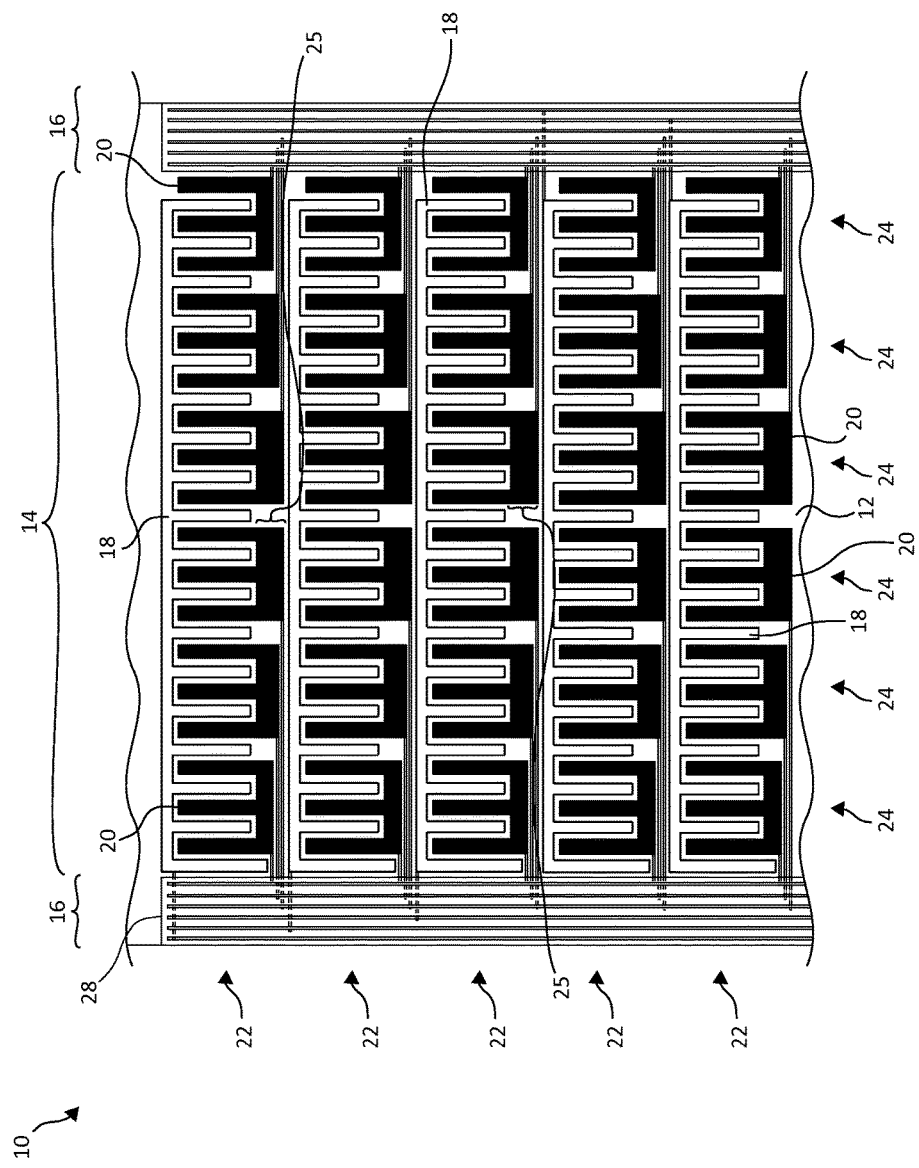
FIG. 3 is a plan view of an embodiment of a touch sensor array.

FIG. 3 is a plan view illustrating a capacitive (or touch) sensor array 10 according to one embodiment. The touch sensor array 10 includes a substrate 12 having a central (or active) portion 14 and outer (or bezel) portions 16 on opposing sides of the central portion 14, near the edges of the substrate 12. The central portion 14 of the substrate 12 may correspond to the visible area of the touch sensor device 2 (FIG. 1), and the outer portions 16 of the substrate 12 may correspond to the non-visible area 3 of the touch sensor device 2. In one embodiment, the substrate 12 is made of an electrically insulating material with high optical transmissivity, such as glass, polyethylene terephthalate (PET), or a combination thereof.

An array of electrodes is formed on the central portion 14 of the substrate 12, which includes a first set (or plurality) of electrodes (also, "first electrodes") 18 and a second set of electrodes (also, "second electrodes") 20. In the embodiment shown in FIG. 3, the first electrodes 18 are substantially "comb" shaped having comb members facing down as shown in FIG. 3. In the depicted embodiment, five first electrodes 18 are included, which are arranged horizontally (as shown in FIG. 3) and substantially extend the entire width of the central portion 14 of the substrate 14. It should be understood thought that other embodiments may use different numbers of electrodes.

Still referring to FIG. 3, the second electrodes 20 are substantially "E" shaped and arranged such that the members thereof extend upwards (as shown in FIG. 3). In the embodiment shown, thirty second electrodes 20 are included which are arranged in rows (i.e., horizontal rows) 22, each of which is associated with one of the first electrodes 18, and columns (i.e., vertical rows) 24. In the exemplary embodiment shown, each of the rows 22 includes six of the second electrodes 20, and each of the columns 24 includes five of the second electrodes 20. Within each row 22, the second electrodes 20 are mated with the respective first electrode 18 such that the members extending from the first electrodes 18 and the second electrodes 20 are inter-digitated. However, specific patterns shown in FIG. 3 are exemplary, and other electrode shapes which may not be inter-digitated are possible.

As shown in FIG. 2, the size and shape of the second electrodes 20 vary across the central portion 14 of the substrate 12. In particular, the thickness of the horizontal (as shown in FIG. 1) portions (or base portions) 25 of the second electrodes 20 is greater nearer the center of the substrate 12.

As will be described in more detail below, the first electrodes 18 may be used as "transmitter" (TX) electrodes, and second electrodes 20 may be used as "receiver" (RX) electrodes. However, it should be understood that these roles may be reversed in other embodiments.

Figure 4:
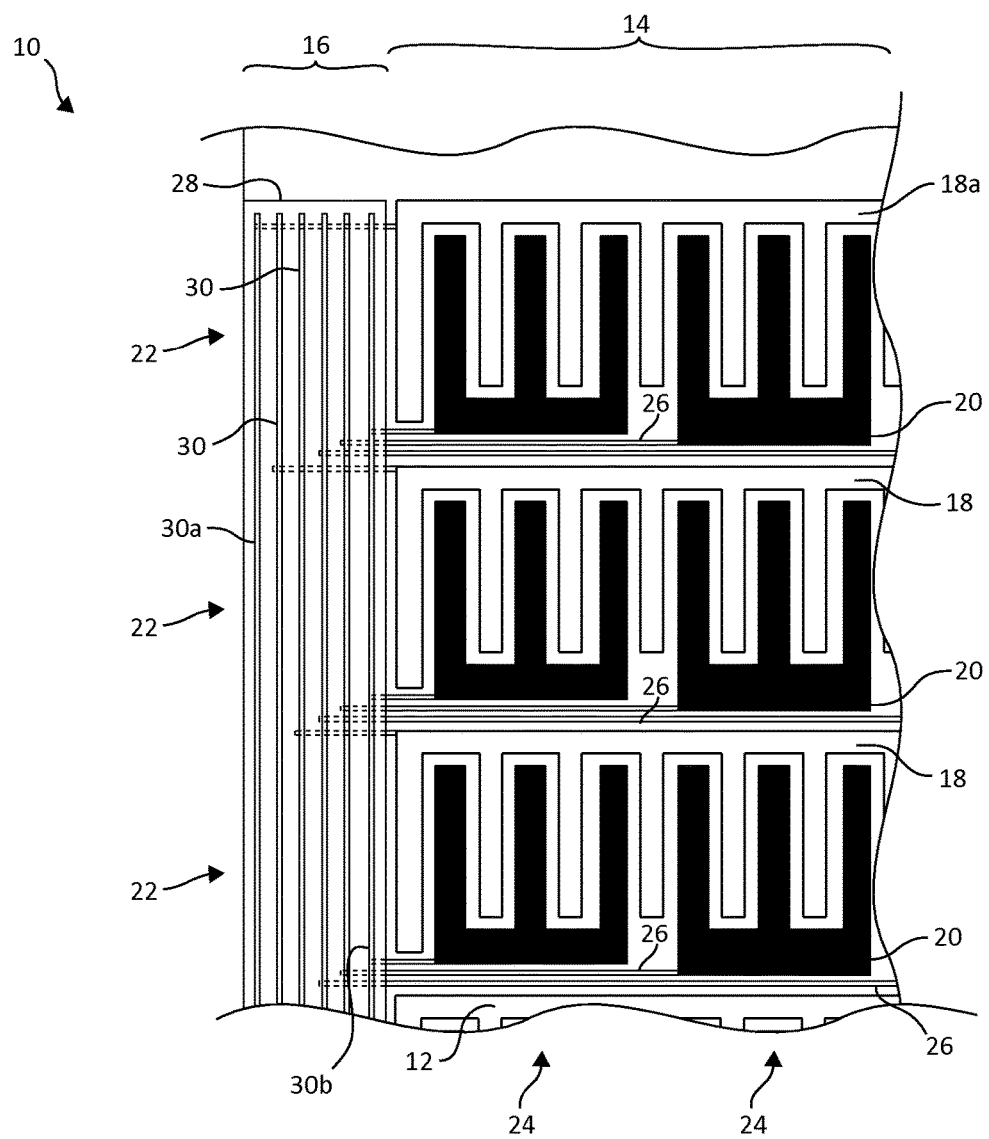
FIG. 4 is a plan view illustrating a portion of the touch sensor array of FIG. 3 in greater detail.

Referring now to FIG. 4 in combination with FIG. 3, the touch sensor array 10 also includes a (first) plurality of conductors, or primary traces, 26 formed on the substrate 12. In the example shown, the primary traces 26 extend substantially horizontally (as shown in FIG. 4) across the substrate 12. As shown, each of the primary traces 26 is connected to, and thus in electrical contact with, a respect one of the first electrodes 18 or one of the second electrodes 20 at a first end portion thereof, and has a second end portion extending into one of the outer portions 16 of the substrate. The primary traces 26 may be considered to include a first set associated with (i.e., in contact with) the first electrodes 18 and a second set associated with the second electrodes 20.

The first electrodes 18, the second electrodes 20, and the primary traces 26 may be made of indium tin oxide (ITO) and may be formed in a substantially planar manner. That is, although not specifically shown in FIGS. 3 and 4, the first electrodes 18, the second electrodes 20, and the primary traces 26 may have substantially the same thickness (e.g., 300 Angstroms (Å)) and lay in substantially the same plane.

Still referring to FIGS. 3 and 4, an insulating material (or body or layer) 28 is coupled or attached to the outer portions 16 of the substrate 12. The insulating material 28 covers the end portions of the primary traces 26 that extend onto the outer portions 16 of the substrate 12. The insulating material 28 may be made of, for example, an epoxy or resin material and have a thickness of, for example, between 5 and 25 micrometers (μm) that is deposited on the substrate 12. It should be noted that the insulating material (or insulating bodies) 28 do not extend over the central portion 14 of the substrate.

A (second) plurality of conductors, or secondary traces, 30 are formed on the insulating material 28 over both outer portions 16 of the substrate 12. In one embodiment, the secondary traces 30 are made of silver. Of particular interest in the depicted embodiment is that each of the secondary traces 30 is electrically connected to either one (and only one) primary trace 26 associated with one of the first electrodes 18 or all of primary traces 26 associated with the second electrodes 20 in one (and only one) of the columns 24 of second electrodes.

For example, referring specifically to FIG. 4, the "first" secondary trace 30a (i.e., counting from left to right in FIG. 4) is electrically connected to the top-most first electrode 18a (though the appropriate primary trace 26), and the "sixth" secondary trace 30b is electrically connected to all of the second electrodes 20 in the left-most column 24 of second electrodes 20. The remaining electrical connections between the secondary traces 30 and the primary traces 26, and thus the remaining electrodes 18 and 20, are shown in FIGS. 3 and 4, and are similar in both outer portions 16 of the substrate 12.

The insulating material 28 electrically separates each secondary trace 30 from the other primary traces 26 (i.e., those to which that particular secondary trace 30 is not electrically connected). For example, in FIG. 4, the insulating material 28 insulates the "sixth" secondary trace 30b from the primary traces 26 connected to the second electrodes 20 that are not in the left-most column 24 of second electrodes 20. That is, the primary traces 26 connected to the second electrodes 20 that are not in the left-most column 24 extend below the "sixth" secondary trace 30b without making an electrical connection to the "sixth" secondary trace 30b. The construction of the insulating material 28, along with that of the secondary traces 26, will be described in greater detail below.

As such, the secondary traces 30 provide unique electrical connections for each "pair" of the first electrodes 18 and the second electrodes 20 (i.e., one of the first electrodes 18 and one of the second electrodes 20 associated and inter-digitated with that particular first electrode 18). For example, referring again to FIG. 4, one such pair of electrodes may include the top-most first electrode 18 and the left-most second electrode 20 in the top row 22. Through the secondary traces 30, this pair of electrodes is provided with electrical connections specifically through the "first" secondary trace 30a and the "sixth" secondary trace 30b. However, the pair of electrodes that includes the top-most first electrode 18 and the next second electrode 20 to the right in the top row 22 is provided with electrical connections through the left-most secondary trace 30 and the "fifth" secondary trace 30 as shown in FIG. 4.

It should also be understood that the touch sensor array 12 may include an additional set of traces not shown in the figures. This additional set of traces may be used to provide a ground to electrically isolate the first electrodes 18 and the immediately neighboring primary traces 26 connected to the second electrodes 20. As such, each of the ground traces may be electrically connected to one of the secondary traces 30 in a manner similar to the respective primary traces 26. The ground traces may be all connected to the same secondary trace that is used to connect them to the system ground.

In the particular example shown in FIGS. 3 and 4, thirty pairs of electrodes are included, and unique electrical connections are provided to each of the pairs using twelve secondary traces 30, while the central (or active) portion 14 of the substrate 12 includes only a single layer of structures formed thereon.

It should be noted, in other embodiments, the insulating material 28 may be a flexible substrate, such as an FPC, attached to the substrate 12. However, in an embodiment utilizing an FPC, the electrical connections between the primary traces 26 and the secondary traces 30 may be similar to those described above and shown in FIGS. 3 and 4, as well as those described below with respect FIGS. 5-11. In other words, when considered schematically, FIGS. 3, 4, and 5-11 may be understood to illustrate the electrical connections betweens the primary traces 26 and the secondary traces 30 in embodiments utilizing the insulating material formed on the substrate 12 as well as those utilizing an FPC.

In operation, the secondary traces 30 are coupled to (i.e., are in operable communication with) an electronic system (an example of which is described below). In general, the capacitive sensor array 10 is operated by providing a signal to one of the first electrodes 18 (i.e., TX electrodes) while grounding the other first electrodes 18. Signals are generated in the second electrodes 20 associated with the driven first electrode 18 by electrical coupling of the driven first electrode 18 to the second electrodes 20 associated with the driven first electrode 18. The signal induced in the second electrodes 20 may change due to the presence of an object (e.g., a finger) on, or near, that portion of the sensor array 10. The signal change in the second electrodes 20 is indicative of change in the capacitance between the second electrode 20 and the respective first electrode (i.e., "mutual capacitance"). This process is continuously repeated for each of the first electrodes 18 and each of the associated rows of second electrodes 20.

In the embodiment shown in FIG. 3, the primary traces 26 for the second electrodes 20 are routed to the long(er) sides of the substrate 12. As shown, the primary traces 26 connected to the second electrodes 20 that occupy the left side of the central portion 14 (i.e., are closer to the outer portion 16 on the left) extend into the outer portion 16 on the left. Likewise, the primary traces 26 connected to the second electrodes 20 that occupy the right side of the central portion 14 (i.e., are closer to the outer portion 16 on the right) extend into the outer portion 16 on the right. The primary traces 26 for the first electrodes 18 are arranged such that some (e.g., for the first electrodes 18 in the upper region of the central portion 14) extend into the outer portion 16 on the left, while the remaining primary traces 26 (e.g., for the first electrodes in the lower region of the central portion 14) extend into the outer portion 16 on the right. This method of routing may minimize the size of the side bezels, and also minimizes the width of the gap between the sensor rows 22.

Although the "side" bezel topology shown in FIG. 3 may be implemented using ITO formed on glass, it may be most suitable for ITO on PET, as in this topology the length of the primary traces 26 is relatively short compared to the "bottom" bezel topology described below. Furthermore, due to geometrical configuration of the electrodes, there are far less traces in the gap between consecutive rows. Thus, the traces in a side bezel configuration may be wider, and the material used for the traces may have higher sheet resistance. Typically, ITO/PET has a higher sheet resistance than that of ITO/glass.

Furthermore, to keep manufacturing costs lower than ITO/Glass technology, usually photolithography is not used for patterning ITO/PET. Therefore, the minimum line width and space in ITO/PET is much higher than those in ITO/Glass. Nevertheless, in side bezel sensors, higher sheet resistance and greater trace widths may be tolerated. Therefore, ITO/PET with greater ITO sheet resistance and wider traces may be preferred for side bezel topology.

Figure 5:
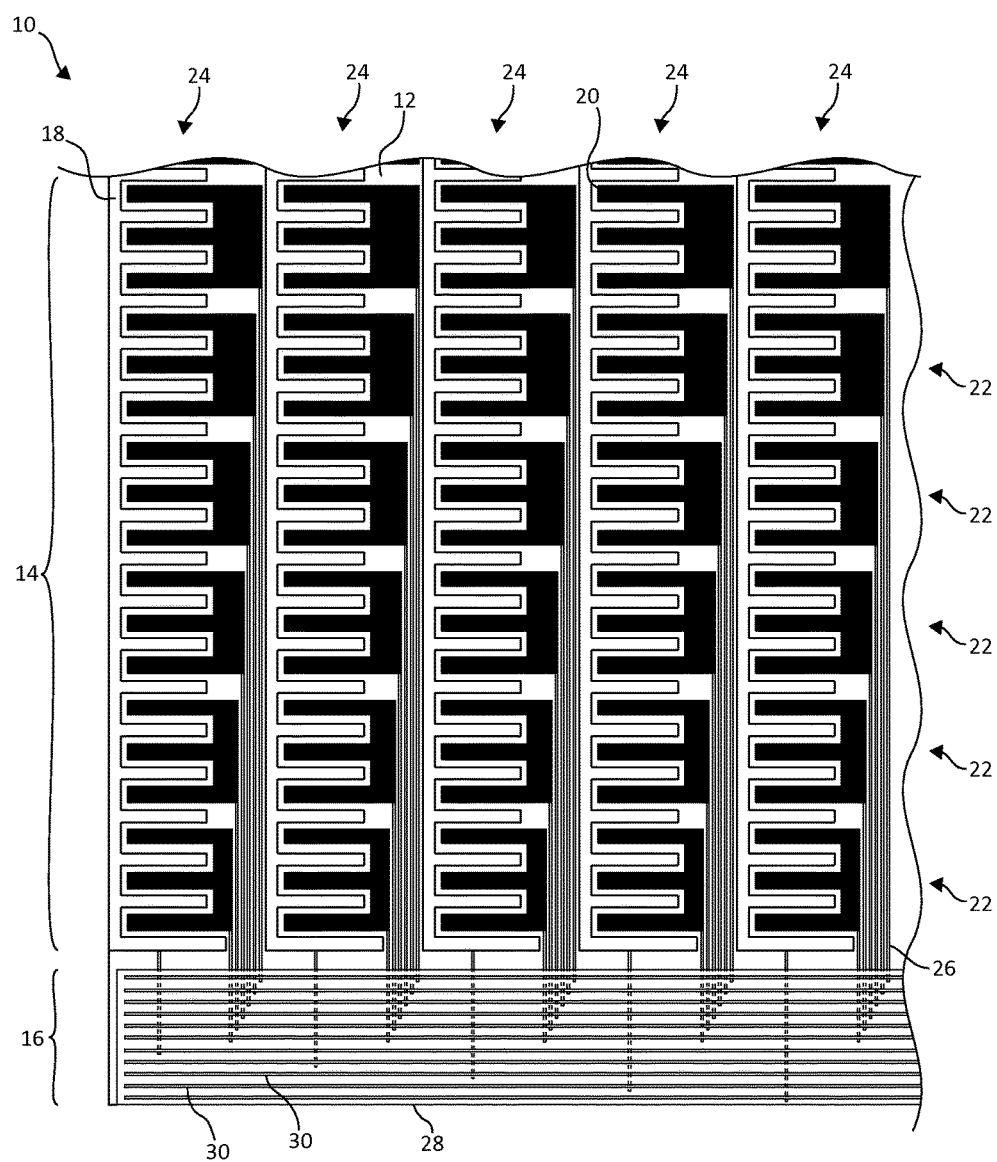
FIG. 5 is a plan view illustrating another embodiment of a touch sensor array.

FIG. 5 illustrates the touch sensor array 10 according to another embodiment of the present invention. Similar to the embodiment shown in FIG. 3, the touch sensor array 10 shown in FIG. 5 includes a substrate 12 with an active portion 14 and a bezel portion 16. However, only one bezel portion 16 is included along the bottom (as shown in FIG. 5) edge of the substrate 12. The touch sensor array 10 also includes an array of first electrodes 18 and second electrodes 20. The substrate 12 as shown in FIG. 5 has been rotated compared to that of FIG. 3 such that the columns 24 correspond to the first electrodes 18, and the rows 22 correspond to the second electrodes 20.

Because there is only one bezel portion 16, all of the primary traces 26 extend from the first electrodes 18 and second electrodes 20 towards the bottom of the substrate 12, across the entire active portion 14. Within the bezel portion 16, the primary traces 26 are electrically connected to the secondary traces 30 in a manner similar to that described above (i.e., such that each electrode pair is provided electrical connections through a unique pair of the secondary traces 30).

One skilled in the art may appreciate that due to the electrical resistance of the traces, the embodiment shown in FIG. 5 may be more suitable for smaller devices (e.g., with diagonal lengths across the active area 14 of, for example, 10 centimeters or less).

Figure 6:
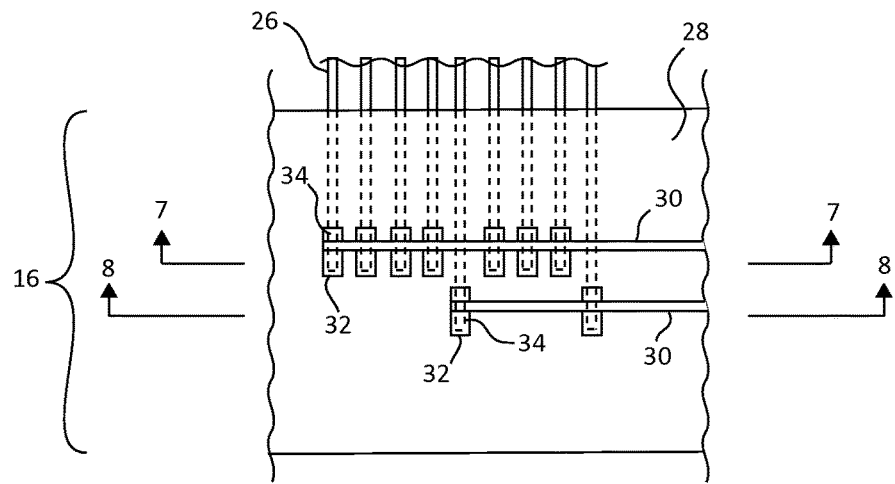
FIG. 6 is a plan view of a bezel portion of the touch sensor array of FIG. 1.
Figure 7:
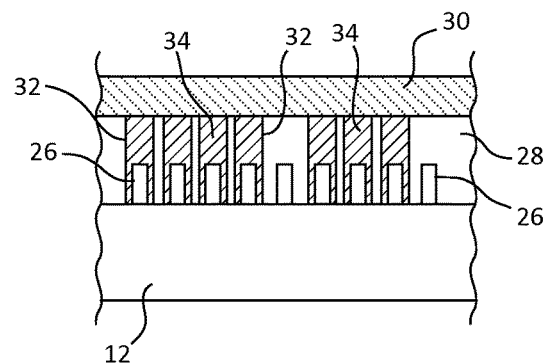
FIGS. 7 and 8 are cross-sectional views of the bezel portion of FIG. 6 taken along lines 7-7 and 8-8, respectively.
Figure 8:
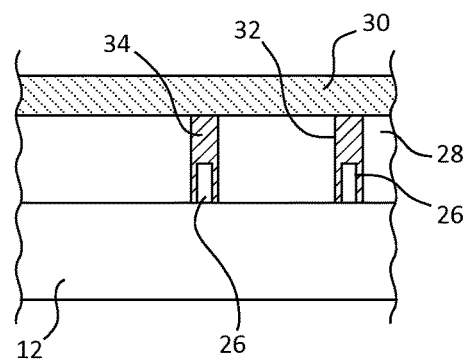

FIGS. 6, 7, and 8 illustrate, in greater detail, the insulating material 28, the primary traces 26, and the secondary traces 30 on an outer portion 16 of substrate 12 according to one embodiment of the present invention. The example shown includes nine primary traces 26, with seven of the primary traces 26 being electrically connected to a first secondary trace 30 (FIG. 7) and two of the primary traces 26 (extending farther into the insulating material 28) being electrically connected to a second secondary trace 30 (FIG. 8). The electrical connections are made through via-holes 32 that are filled with a conductive material 34. As shown specifically in FIG. 7, two of the primary traces 26 are insulated from the first of the secondary traces 30 by the insulating material 28 due, at least in part, to the lack of a via-hole 32 and conductive material 34 formed at those locations.

Figure 9:
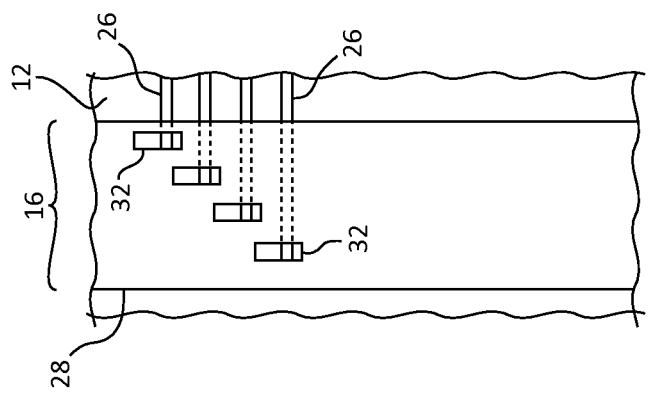
FIGS. 9, 10, and 11 are plan views illustrating an embodiment of a bezel portion of a touch sensor array during the formation thereof.
Figure 10:
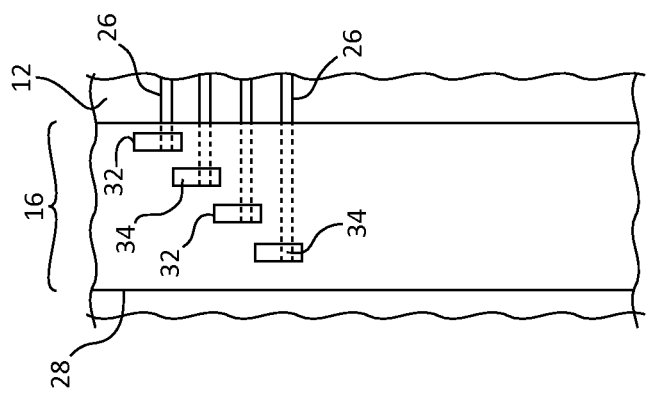
Figure 11:
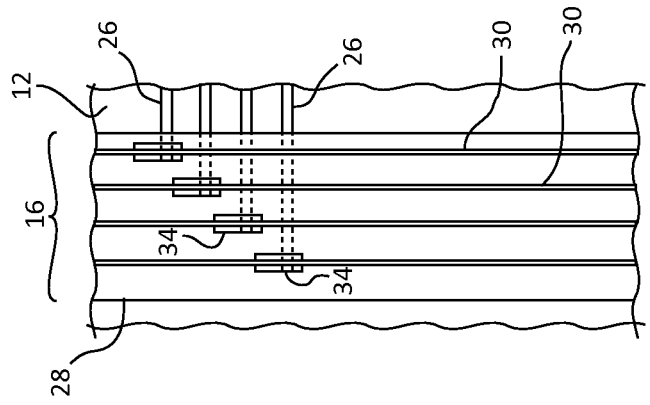

FIGS. 9, 10, and 11 illustrate an outer (or bezel) portion 16 of the substrate 12 and a process for forming the connections between the primary traces 26 and the secondary traces 30 according to one embodiment. Although not specifically shown, in order to form the electrodes (e.g., electrodes 18 and 20 in FIG. 3), a layer of transparent conductive material, such as ITO or a silver nano-particle film, may be deposited on (or over) the substrate 12. The deposition method used may depend on the material chosen. For example, if the material is ITO, the material may be deposited by vacuum sputtering. If the material is silver nano-particles, the material may be deposited by variety of techniques such as dipping method, spin coating, etc. In a preferred embodiment of the invention, the sheet resistance of the conductive material is less than or equal 50 ohm/square.

The conductive layer may then be patterned. Patterning may be achieved by various methods. For example, a resist layer may be deposited on the conductive layer, and the conductive material may be chemically removed in selected areas. Alternatively, patterning the conductive layer may be achieved by removing the material from selected areas using methods such as laser ablation and plasma etching. As another alternative, by using a mask, the conductive layer may be deposited only on the desired areas of the substrate 12. In other words, the conductive material may be deposited in the final desired pattern (i.e., in the appropriate shape to form the electrodes 18 and 20 and the primary traces 26). In such a case, no removal of material is necessary.

As another alternative, the pattern may be generated by the lift off process. In such a process, a mask material is laid down on the bare substrate 12 on the deletion areas where the conductive material is not desired. The conductive material is then deposited on the whole substrate indiscriminately. The mask material may then be chemically removed from the substrate 12 to leave the conductive material in selected areas. In a preferred embodiment of the invention, the finished pattern has a minimum line width of 30 μm, and minimum spacing of 10 μm.

Referring now to FIG. 9, the patterning is performed such that the primary traces 26 extend into the outer portion 16 of the substrate 12. The insulating material (or dielectric layer) 28 is deposited (e.g., using screen printing) on the outer portion 16 of the substrate 12 such that the end portions of the primary traces 26 are covered. The insulating material 28 includes a series of via-holes 32, with each of the via-holes 32 being positioned over a respective one of the primary traces 26. The dielectric material 28 may be any insulating heat curing or UV curing ink available, such as LPI resist and acrylic resin.

Referring now to FIG. 10, the via-holes 32 are then filled with a conductive material to form a conductive via 34 in each of the via-holes 32, which is in contact with the respective primary trace 26. In one embodiment, the conductive material used to form the conductive via 34 is silver ink or copper ink.

In one embodiment, the conductive vias 34 are formed using the same material, and during the same process step, as that is used to form the secondary traces 30. In such an embodiment, the insulating material 28 is thin enough to allow the material of the secondary traces 30 to flow into the via-holes 32 and make reliable contact to the primary traces 26. However, the insulating material 28 may be thick enough such that it does not have any pores or pinholes. In a preferred embodiment, the insulating material 28 is between 5-10 μm thick. In another preferred embodiment, the insulating material 28 is black and acts as a decorative band around the touch sensor array 10. In yet another embodiment of the invention, the via-holes are initially filled with black carbon ink.

Then, as shown in FIG. 11, the secondary traces 30 are formed on the insulating material 28, with each secondary trace 30 extending over, and contacting, one (or more) of the conductive vias 34. Thus, each of the secondary traces 30 is electrically connected to one (or more) of the primary traces 26 through a conductive via 34. As such, the conductive vias 34 may represent contact points, or nodes, for the electrical connection of the secondary traces 30 to the respective primary traces 26. It should be noted that these contact points are external to (i.e., not positioned over) the central portion 14 of the substrate 12.

A black ink may be used as the insulating material 28 to hide the traces and interconnects in the outer portion 16. If the touch sensor device is a sensor on lens (SOL) design, it may be desirable to hide the metal traces. A sensor on lens is a touch sensor device that includes a lens and the electrodes deposited on its bottom surface. In such an embodiment, the black ink may serve to hide the secondary traces and provide insulation between the primary traces 26 and secondary traces 30. The via-holes 32 in the black ink may still show the secondary traces 30. To prevent this, the via-holes 32 may be filled with conductive carbon ink (which is also black). The use of a conductive ink also facilitates the formation of a good electrical connection between the primary traces 26 and the secondary traces 30.

Other colors may be used for the insulating material 28. For example, a white insulating layer may be used. In such an embodiment, the via-holes 32 are filled with white ITO ink, which is a mixture of ITO and a white pigment, prior to the formation of the secondary traces 30. The white ITO is also a conductive ink and is thus suitable to form the conductive vias 34.

Figure 12:
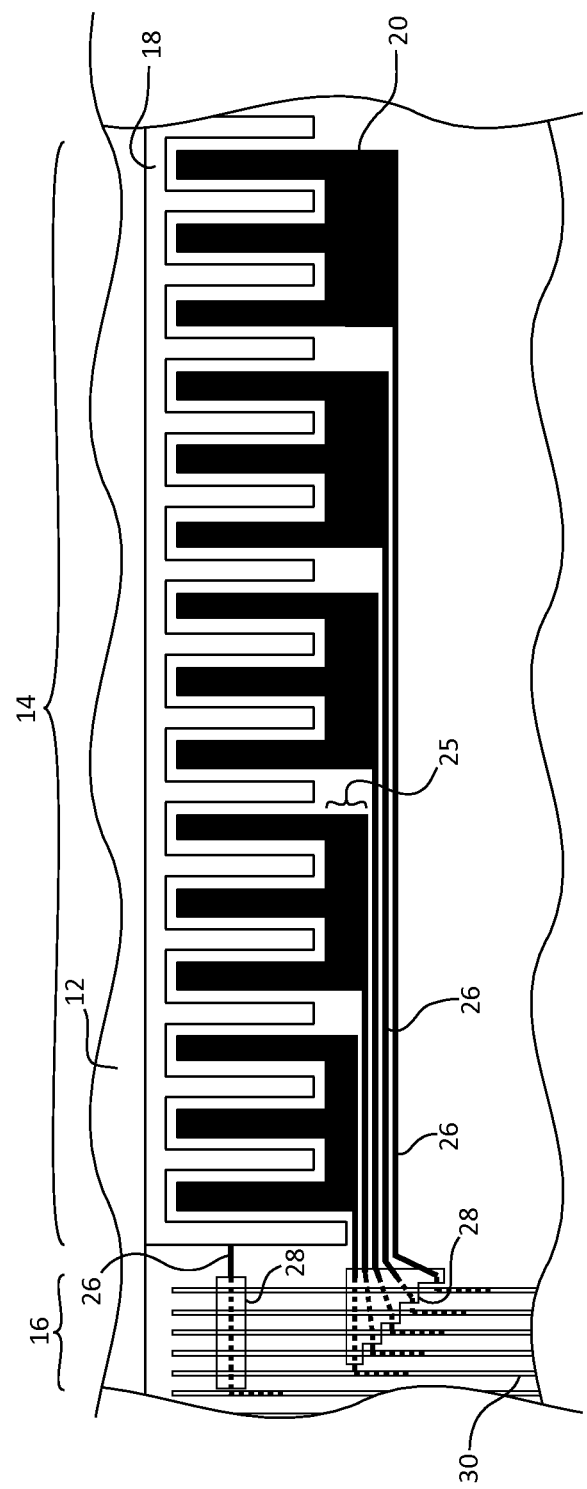
FIG. 12 is plan view illustrating a further embodiment of a touch sensor array.

In one embodiment, the insulating material (or bodies) 28 are only applied over the primary traces 26 wherever necessary to avoid undesired contacts. Such an embodiment facilitates reducing the area of the bezel used for interconnections, reduces the amount of insulating material used in the process, and eliminates any potential difficulties in making good contact between the primary traces 26 and the secondary traces 30, as via-holes and conductive vias are not needed. FIG. 12 illustrates such an embodiment, including a row of second electrodes 20, primary traces 26, and outer portion 16 of a substrate 12 according to another embodiment.

As shown, as the primary traces 26 extend into the outer portion 16, the primary traces 26 "fan out." That is, as the primary traces 26 extend into the outer portion 16 of the substrate 12, the distance between adjacent primary traces 26 increases. Also of particular interest in the embodiment shown in FIG. 12 is the size and shapes (e.g., a "polygonal" shape) of the insulating material (or bodies) 28, which allows the insulating material 28 to appropriately insulate and connect the primary traces 26 and the secondary traces 30 without via-holes and/or conductive vias being formed therein. More specifically, the insulating material 28 allows the secondary traces 30 to pass over, and remain insulated from, the appropriate primary traces 26. In the example shown, a first insulating body 28 is used to selectively insulate the primary traces 26 connected to the second electrodes 20 from the secondary traces 30, while a second insulating body 28 is used to selectively insulate the primary traces 26 connected to the first electrode 18 from the secondary traces 30.

As shown, the first insulating body 28 is shaped to have multiple tiers or portions such that the width of the insulating material decreases as the insulating material extends from the central portion 14 of the substrate 12. Further, it should be noted that the two outer most secondary traces 30 do not extend over the first insulating body 28. Thus, the size and shape of the first insulating body 28 allows for each of the primary traces 26 shown to be electrically connected to only one of the secondary traces 30 while minimizing the amount of insulating material used. Likewise, the second insulating body 28 insulates the primary trace 26 connected to the first electrode 18 from all but the outer most secondary electrode, also while minimizing the amount of insulating material used.

To reduce the routing area in the bezel (or outer portion 16), the trace width and spacing of the traces in the bezel area are minimized. In a preferred embodiment, a metal trace line width of 10-50 μm and a spacing of 10-50 μm is used in the bezel area.

When the traces are very narrow (e.g., 10-50 μm) it may be difficult to establish a low contact resistant between the primary traces 26 and the secondary traces 30 unless the contact area is large enough. Still referring to FIG. 12, in one embodiment, the end portions of the primary traces 26 are "bent" into an L-shaped pattern to increase the contact area between the primary traces 26 and the secondary traces 30. More specifically, the end portions of the primary traces 26 are bent in a direction substantially parallel to the direction in which the secondary traces 30 extend.

As mentioned with reference to FIG. 3, in some embodiments, width of the base portion 25 of the second electrodes 20 varies to fill the void spaces created otherwise. Referring again to FIG. 12, the second electrode 20 nearest to the bezel (i.e., the first second electrode) uses a short primary trace 26 and uses the minimum base portion width. The next primary trace 26 is positioned at least the width of the first primary trace 26 (e.g., 10-50 μm) plus a minimum spacing from the base portion of the first second electrode 20 and may also have a minimum width of 30-50 μm. Therefore, the base portion of the next second electrode 20 may have a width which is wider than the first second electrode 20 base width by an amount equal to, for example, the width of the primary traces 26 combined with the distance between adjacent primacy traces 26. Using such a layout method, the base of each subsequent second electrode 20 may increase by a fixed amount which is equal to the trace width combined with the trace spacing.

It should be noted that the order in which the components are formed on the substrate 12 may be changed. For example, referring once again to FIG. 12, the secondary traces 30 may be formed on the outer portion 16 of the substrate 12 before the insulating body 28 and the primary traces 26 are formed. For example, the secondary traces 30 may be formed on the outer portion 16 in a flat, planar manner (i.e., not over the insulating body 28). The insulating body 28 may then be formed over the secondary traces 30. Then, the primary traces 26 (along with the electrodes 18 and 20) may then be formed such that they extend over the insulating body 28 and connect with the secondary traces 30 in a manner similar to that described above. In such an embodiment, the lateral spatial relationships between the primary traces 26, the secondary traces 30, and the insulating body 28 may be similar to that shown in FIG. 12.

Figure 13:
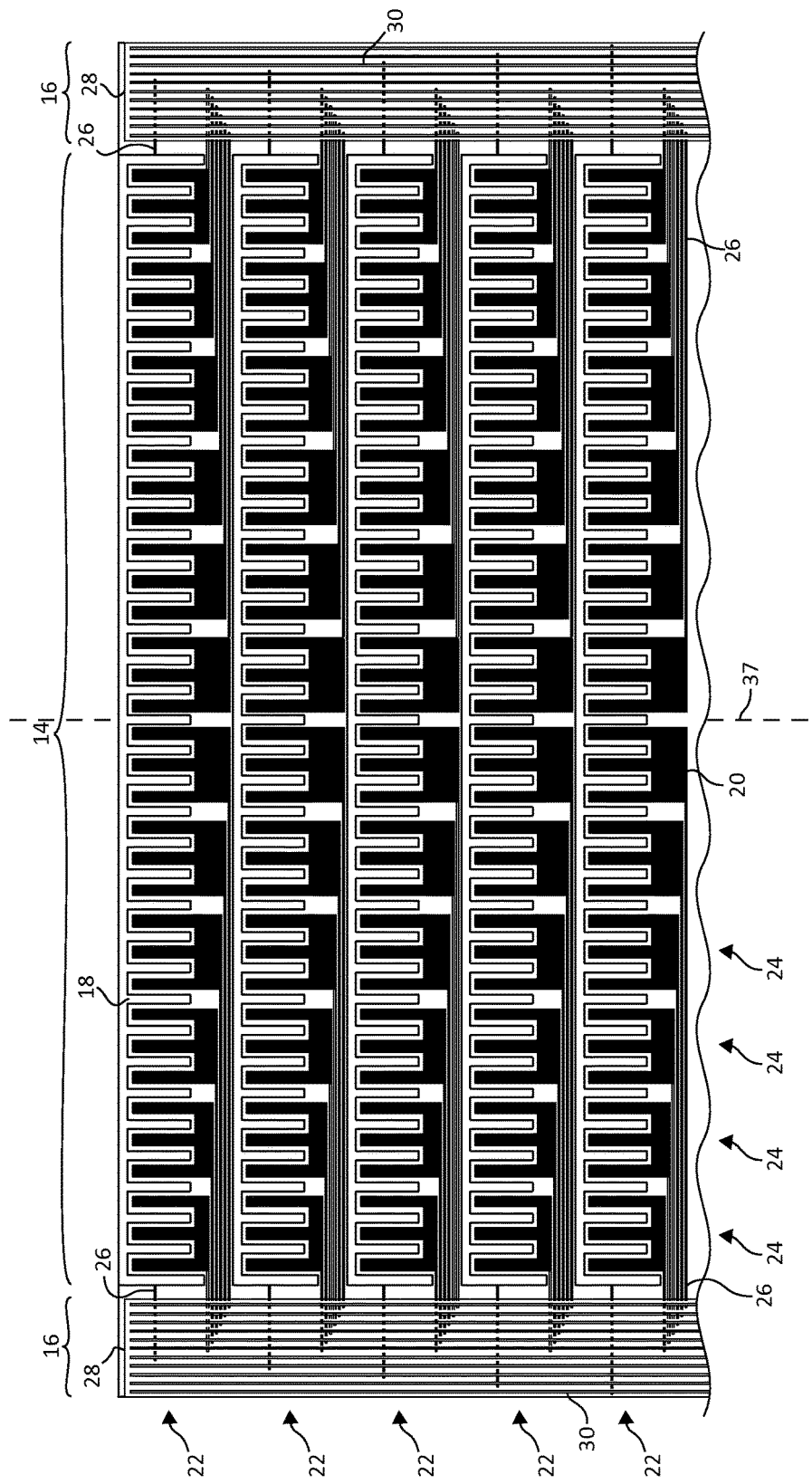
FIG. 13 is a plan view illustrating another embodiment of a touch sensor array.

FIG. 13 illustrates the touch sensor array 10 according to another embodiment of the present invention, which may be particularly well suited for large screen applications (e.g., having a diagonal length greater than 25 cm). As may be apparent when comparing the embodiments shown in FIGS. 3 and 5 with that shown in FIG. 13, the embodiment shown in FIG. 13 is a combination of the of the side bezel topology and the bottom bezel topology. That is, although the bezel (or outer) portions 16 are positioned on the sides, both of the bezel portions 16 includes primary traces 26 (and secondary traces 30) connected to the first electrodes 18 and the second electrodes 20. When compared to the bottom bezel topology shown in FIG. 5, the embodiment shown in FIG. 13 may be considered to be a bottom bezel configuration rotated 90 degrees and "mirrored" about a center line 37 extending through the center portion 14. However, as shown, each row 22 of electrodes includes only one first electrode 18 that extends across the entire center portion 14, which is connected to each bezel portion 16 by a separate primary trace 26 (i.e., the first electrodes 18 are connected to both bezels portions).

As discussed above, in other embodiments, the multi-layer routing of the traces may be accomplished by using a flexible printed circuit (FPC) (and/or a FPC tail), which includes a flexible insulating substrate (i.e., made of an insulating material) with a series of traces (i.e., secondary traces) formed thereon. In such an embodiment, the FPC tail may be coupled to the substrate (e.g., substrate 12) at the edge (or edges) of the active portion 14 and may be wrapped around the substrate 12, effectively eliminating the bezel portion 16 of the array.

Figure 14:
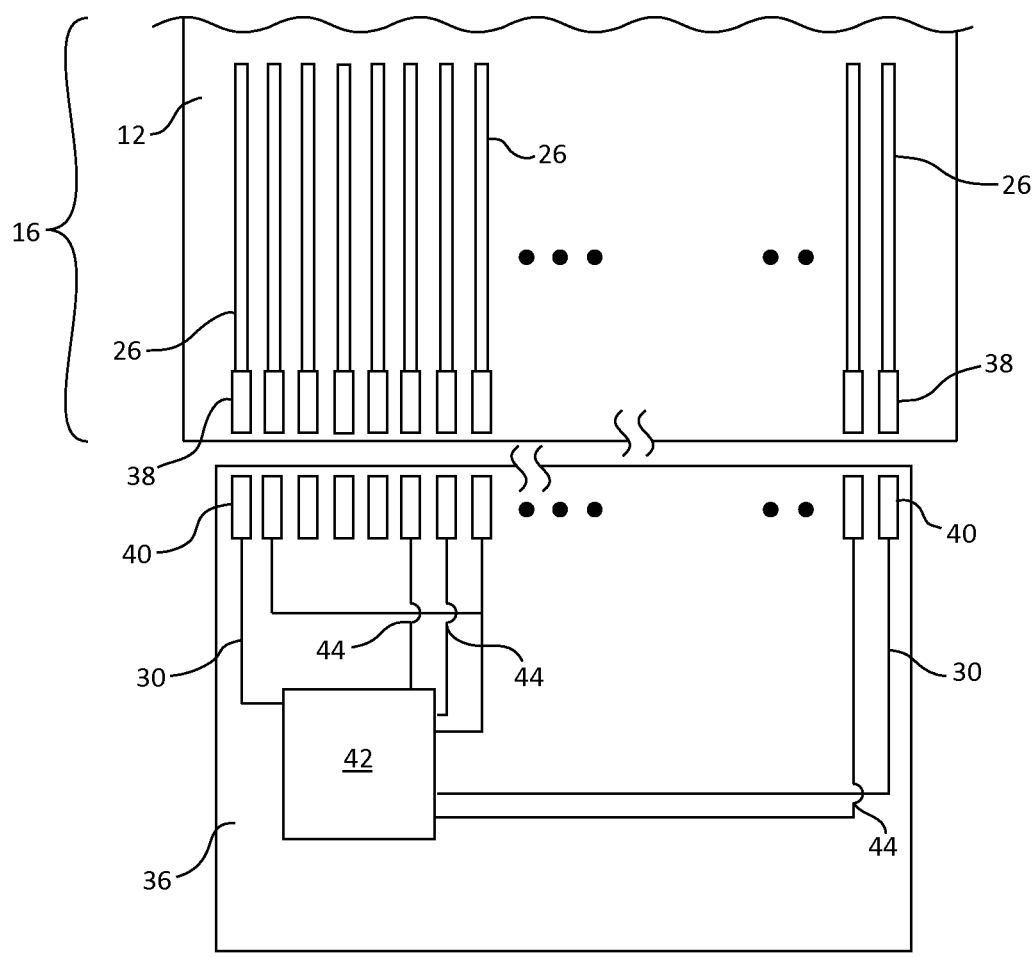
FIG. 14 is a schematic plan view illustrating the bezel portion of a touch sensor array and a flexible printed circuit (FPC)

FIG. 14 schematically illustrates an embodiment utilizing an FPC (and/or FPC tail) 36. As shown, similar to the embodiments described above, the substrate 12 includes primary traces 26 that extend onto the outer portion 16 of the substrate 12. However, a substrate bond pad 38 (e.g., made of ITO or silver) is formed at the end portion of each of the primary traces 26. Although not specifically shown in FIG. 14, the FPC 36 includes one or more flexible insulating layers (e.g., polyamide, polyimide, or PET) interlaced with one or more conductive layers (e.g., copper), which may be formed (or etched) into a series of traces (i.e., the secondary traces 30) that have FPC bond pads 40 at the end portions thereof.

Each substrate bond pad 38 is electrically connected to a unique FPC bond pad 40. In a manner similar to the insulating material 28 formed on the substrate material 28 described above, the desired interconnections between the primary traces 26 and the secondary traces 30 are made within the FPC 36. For example, in FIG. 14 it is shown that the second primary trace 26 from the left is connected to the eighth primary trace 26 from the left through the secondary traces 30 on the FPC 36. The other secondary traces 30 that are connected to a chip 42 on the FPC 36 and encounter the trace 30 connected to the second pad 40 from the left will have to "jump over" (or remain insulated from) that trace to avoid unwanted electrical connection. These jumps are schematically shown in FIG. 14 by reference numeral 44. In an FPC, these interconnections are realized by using two conductive layers on the FPC tail and via-holes that interconnect the two layers.

Figure 15:
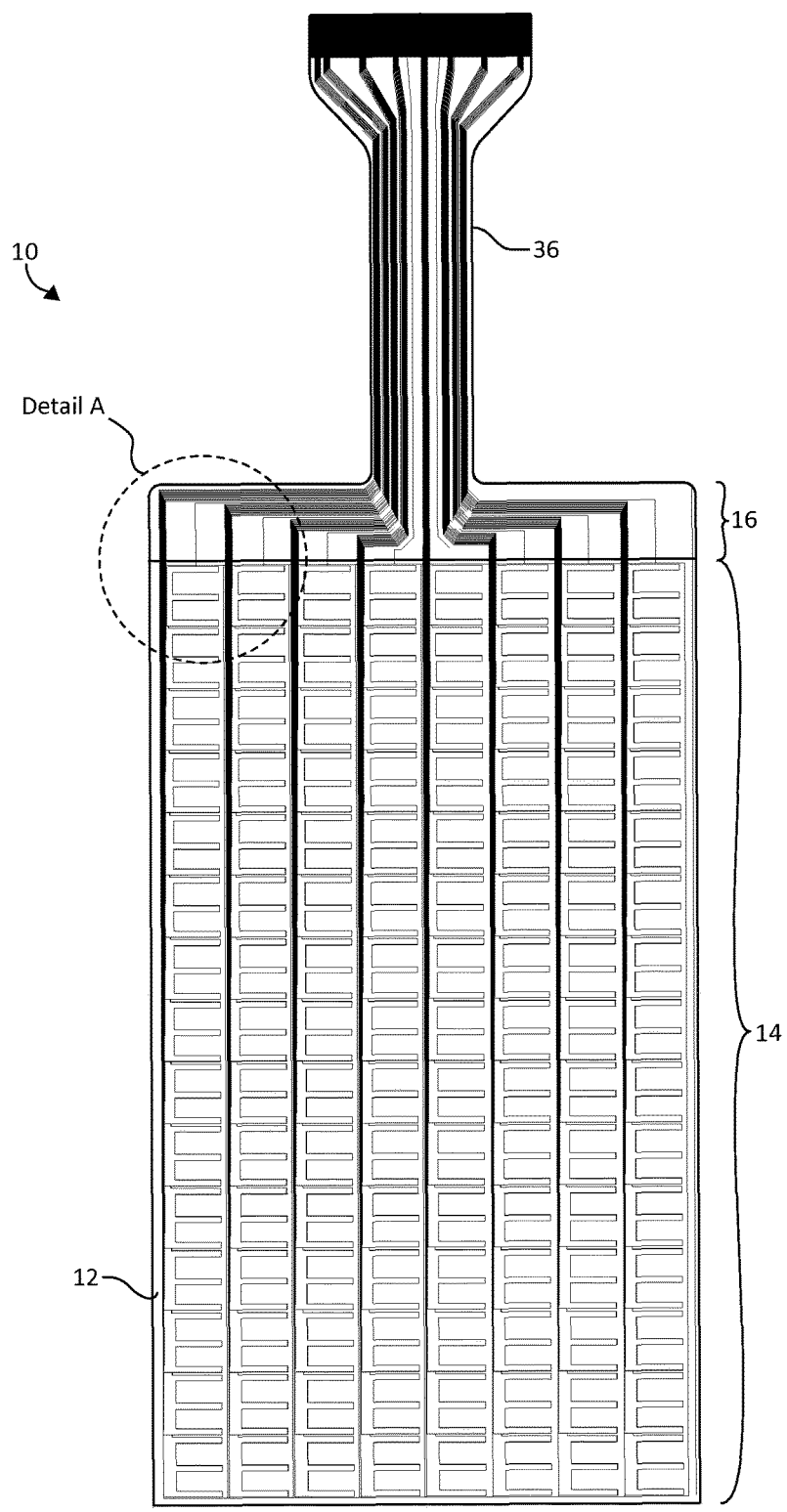
FIG. 15 is a plan view illustrating another embodiment of a touch sensor array.
Figure 16:
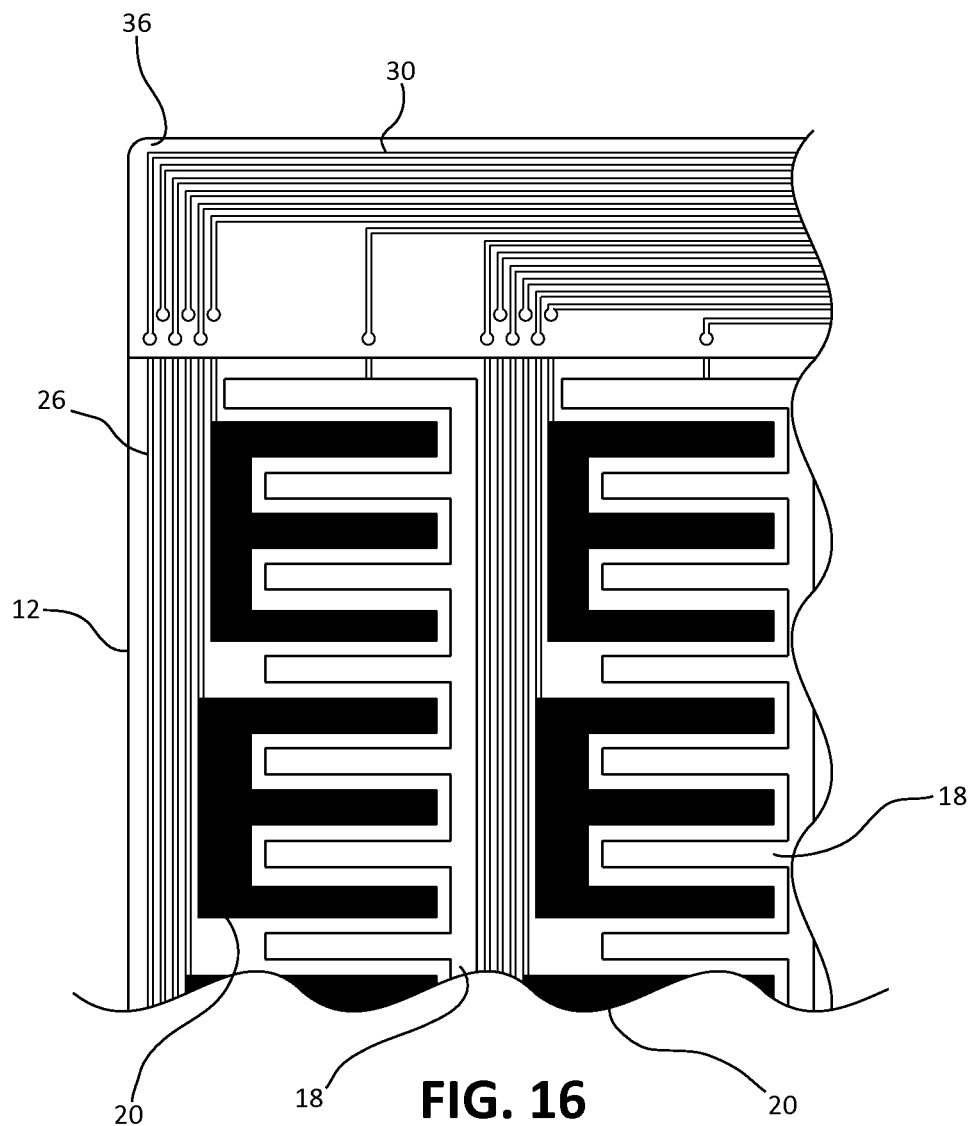
FIG. 16 is a plan view illustrating a portion of the touch sensor array, taken on Detail A, of FIG. 15.
Figure 17:
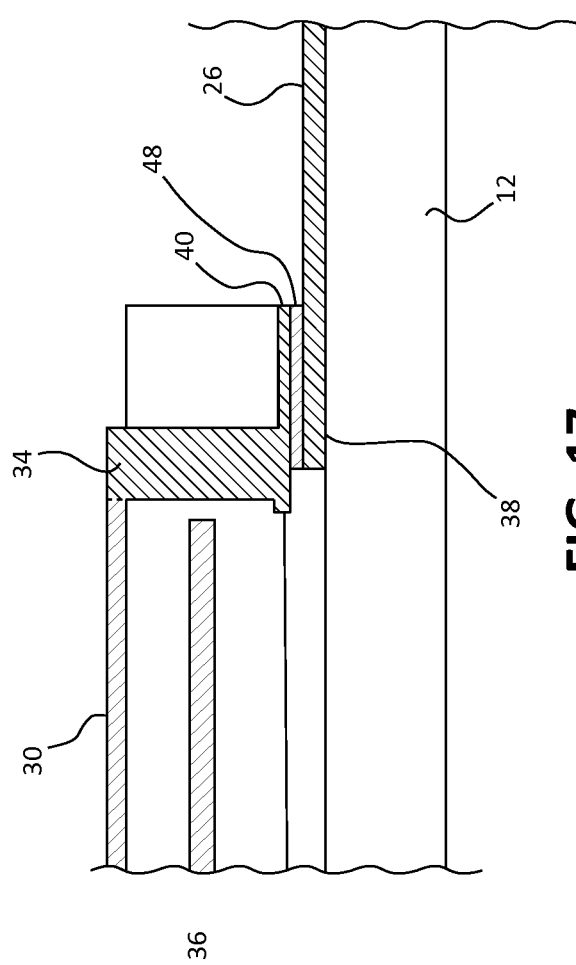
FIG. 17 is a cross-sectional view of the touch sensor array of FIG. 16 taken along line 17-17.

FIGS. 15-17 illustrate an embodiment of the touch sensor array 10 that may use the bottom bezel topology shown in FIG. 5. However, as shown, the substrate 12 has been rotated 90 degrees such that the bezel portion 16 is position on the right side of the substrate 12. In this embodiment, an FPC tail 36 is used to both route the signals from the primary traces 26 (e.g., via bond pads 38 and 40) shown in FIG. 14 as well as connecting to an external system. As shown specifically in FIG. 17, the electrical connections between the primary traces 26 and the secondary traces 30 (formed on the FPC 36) are made via the substrate bond pads 38 at the end portion of the primary traces 26, a bonding material 48, the FPC bond pads 40 formed on the FPC 36, and a conductive material (or via) 34 formed through the FPC 36 (which interconnects the FPC bond pads 40 and the secondary traces 30). As will be appreciated by one skilled in the art, the FPC 36 may be manufactured and configured before being attached to the substrate 12 (i.e., the FPC bond pads 40, the conductive vias 34, and the secondary traces 30 may be selectively formed on the FPC 36 before the FPC 36 is attached to the substrate 12).

In one embodiment, the bonding material 48 is an anisotropic conductive film (ACF), which includes microscopic conductive spheres distributed in a matrix of a soft insulating material. When pressure is applied, the spheres come to contact with each other and form a conduction path for the electric signals. When the ACF is deposited between the sensor bond pads 38 and the FPC bond pads 40, the pressure is only applied in the regions trapped vertically between the pads 38 and 40. Therefore, conduction paths are formed only in the pads regions (i.e., between each sensor bond pad 38 and the associated FPC bond pad 40, even if the ACF is deposited between adjacent sensor bond pads 38 on the substrate 12 and/or between adjacent FPC bond pads 40 on the FPC.

Figure 18:
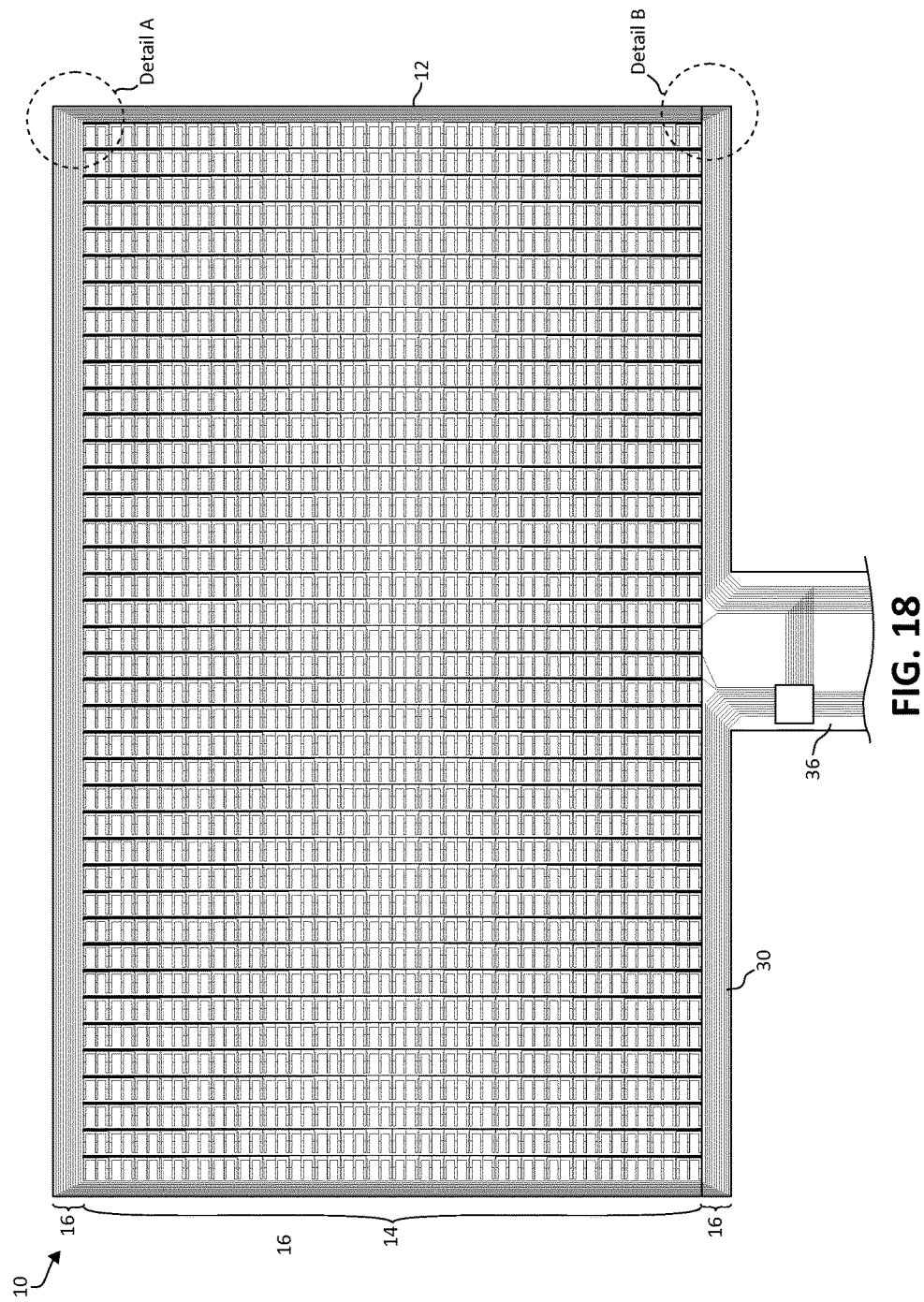
FIG. 18 is a plan view illustrating another embodiment of a touch sensor array.
Figure 19:
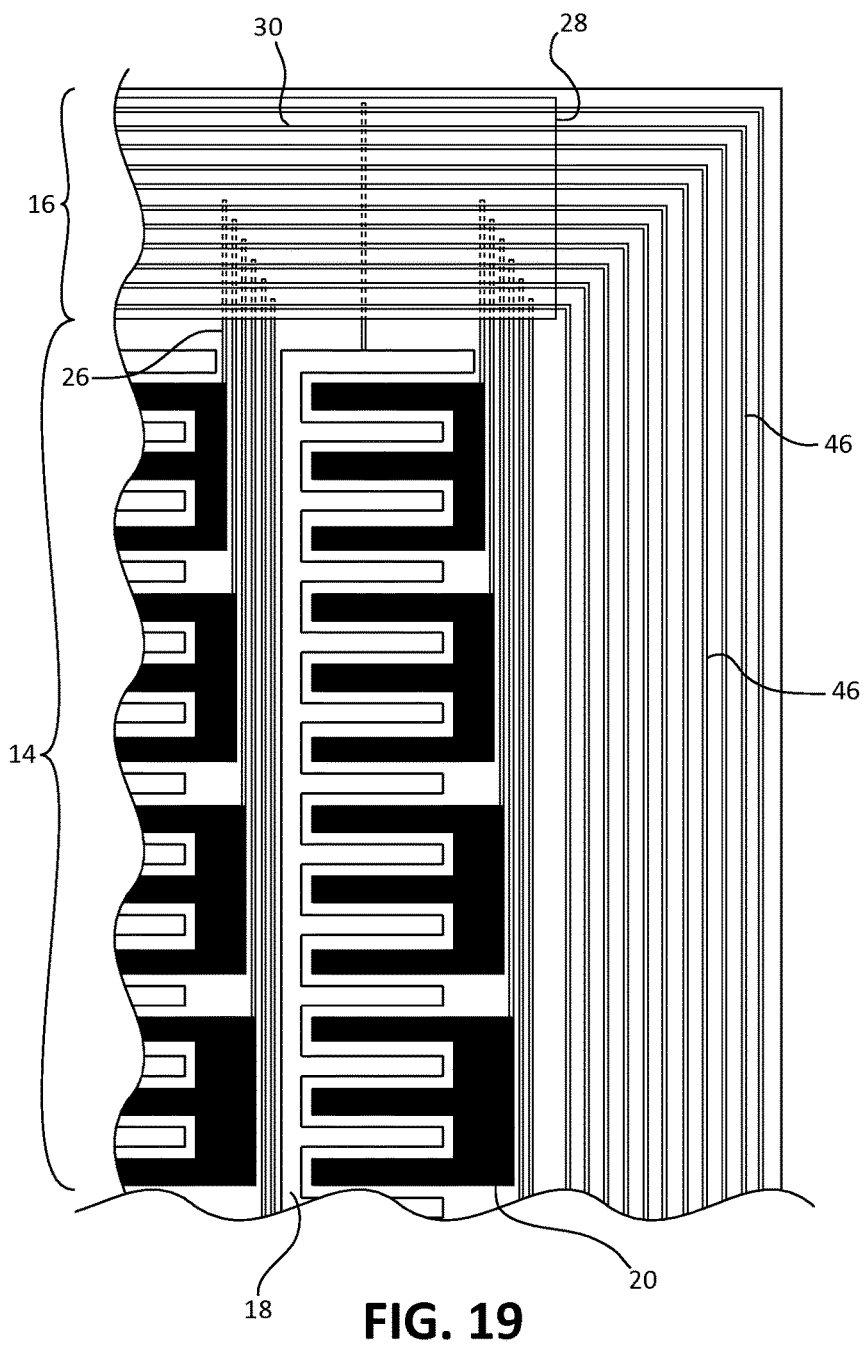
FIG. 19 is a plan view illustrating a portion of the touch sensor array, taken on Detail A, in FIG. 18.
Figure 20:
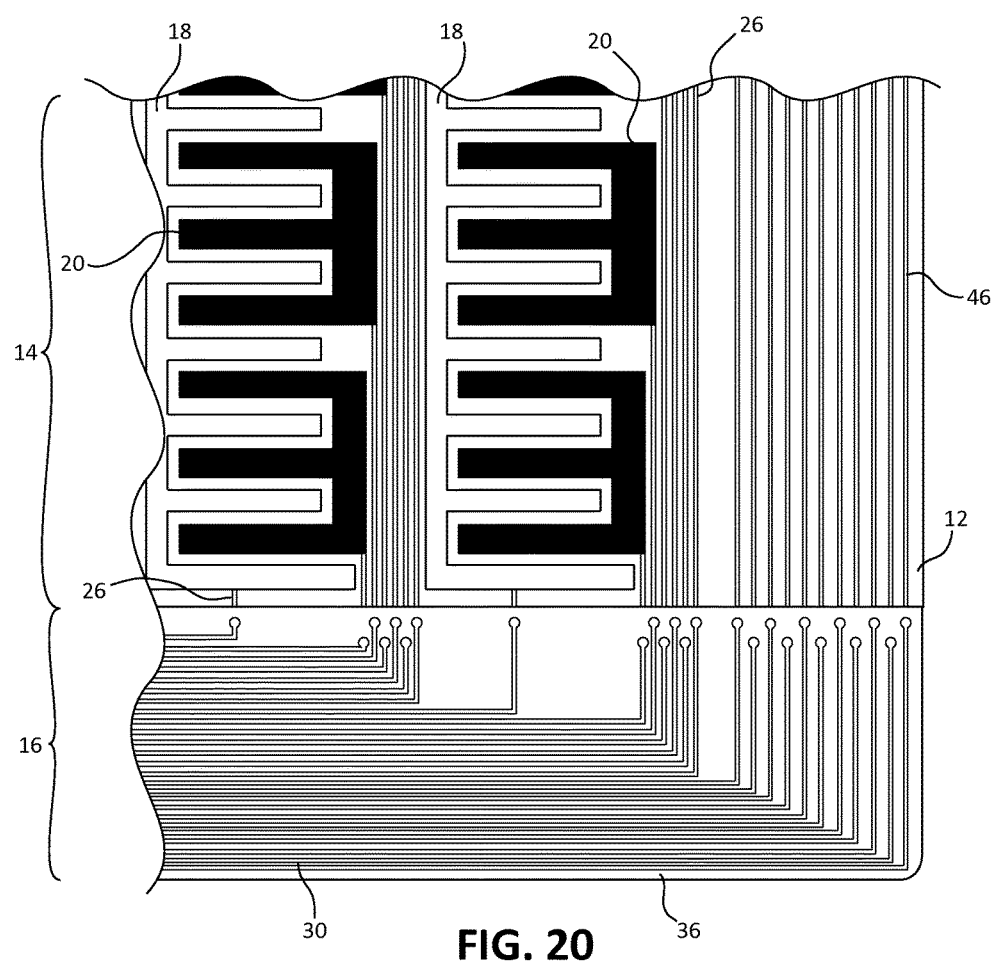
FIG. 20 is a plan view illustrating a portion of the touch sensor array, taken on Detail B, in FIG. 18.

FIGS. 18-20 illustrate an embodiment of the touch sensor array 10 that may be similar to that shown in FIG. 13. That is, the touch sensor array 10 in FIGS. 15 and 16 includes two bezel portions 16. The touch sensor array 10 is arranged such that the bezel portions 16 occupy the top portion and the bottom portion of the device. As shown in FIG. 19, the top bezel portion 16 utilizes the insulating material 28 formed on the substrate, such as that shown in FIGS. 6-11. However, as shown in FIG. 20, the bottom bezel portion 16 utilizes an FPC tail 36 for routing, as well as for connecting to an external system. Additionally, as shown in both FIGS. 19 and 20, a series of routing traces 46 (which may be similar to the secondary traces 30 formed on the insulating material 28) are formed along an edge of the central portion 14 of the substrate 12. The routing traces 46 are electrically connected to the secondary traces 30 on the insulating material 28 at the top bezel portion 16 and electrically connected to the traces within the FPC tail 36. It should be understood that in other embodiment, an FPC may also be used in the top bezel portion 16 for routing the signals from the primary traces 26 to the routing traces 46 (and not for connecting to an external system). Additionally, although the embodiment shown is depicted as having all of the second electrodes facing or oriented in the same direction, in other embodiments, particularly those used in large screen applications, the electrodes may be arranged such that some (e.g., those on one half of the substrate 12) face or are oriented in one direction, while the remaining are oriented in the opposite direction.

Figure 21:
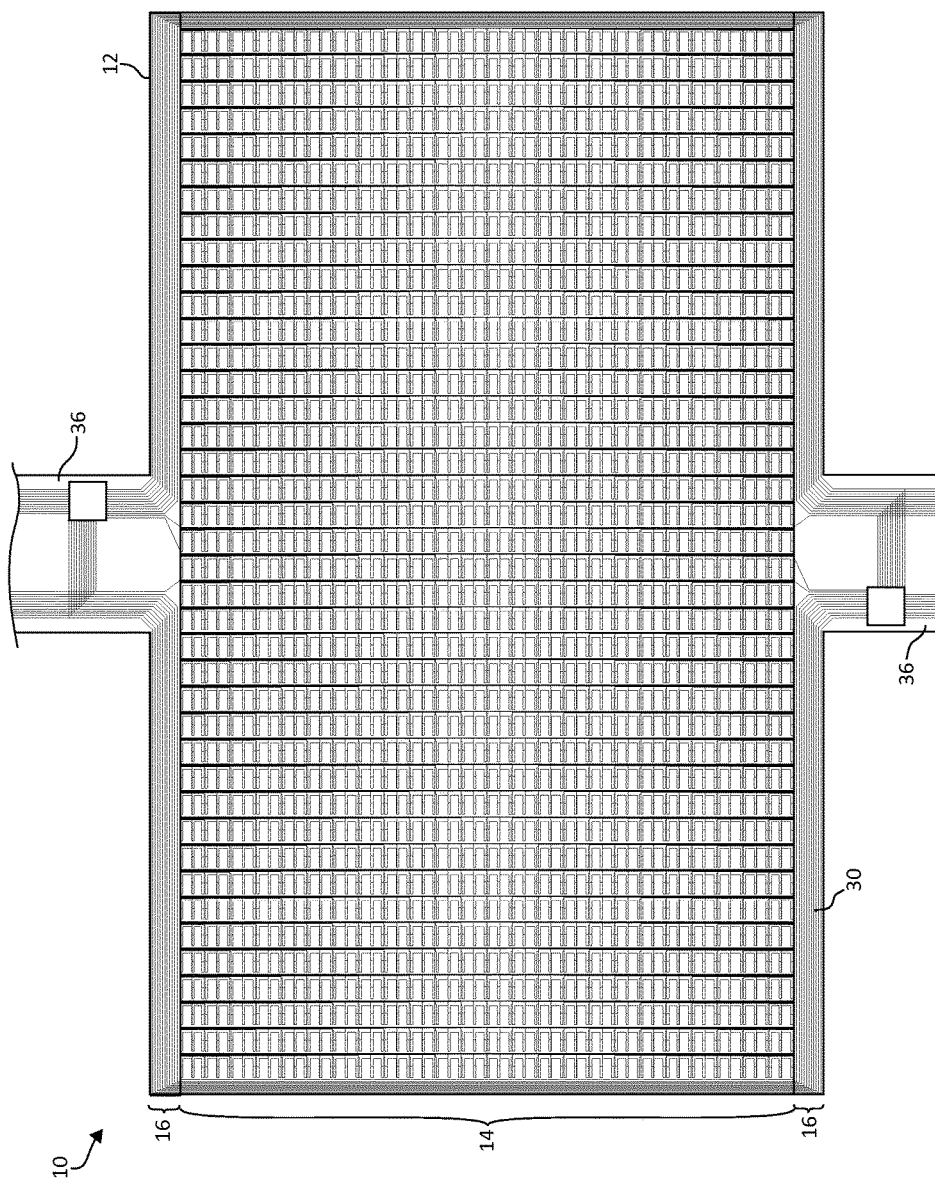
FIG. 21 is a plan view illustrating another embodiment of a touch sensor array.
Figure 22:
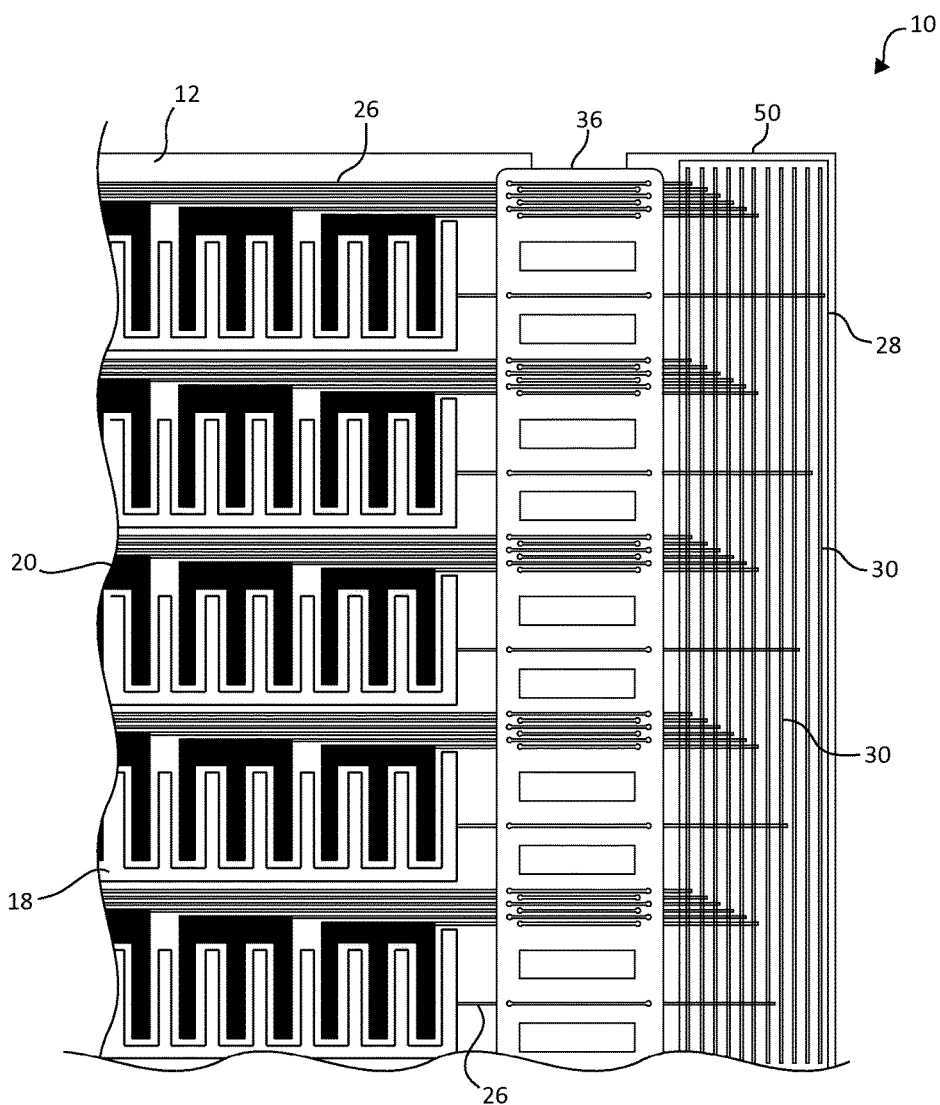
FIG. 22 is a plan view of a portion of another embodiment of a touch sensor array.

Furthermore, in some embodiments, an FPC with a tail may also be used in both the top and bottom bezel portions 16 for both routing the signals from the primary traces 26 and connecting to an external system (i.e., the top bezel portion and the bottom bezel portion utilize separate FPCs/ FPC tails). An example of such an embodiment is shown in FIG. 21.

FIGS. 22-25 illustrate a further embodiment of the present invention. Of particular interest in FIGS. 22-25 is that the insulating material 28 is formed on a second substrate 50 that is separate from the (first electrode) substrate 12. As shown, the second substrate 50 is connected to the first substrate 12 by a FPC (or a Flat Flex Connector FFC) 36. As will be appreciated by one skilled in the art, particularly in light of the use of the FPC described above, the FPC 36 in FIGS. 22-25 is used to electrically connect the primary traces 26 on the first substrate 12 to the secondary traces 30 on the insulating material 28 via bond pads formed on the first substrate 12 (e.g., near the edge or outer portion thereof), traces on the FPC 36, and bond pads and additional traces on the second substrate 50. As such, the secondary traces 30 shown in FIG. 22 may be electrically connected to the primary traces 26 on the first substrate 12 in a manner similar to that described above. Additionally, although not specifically shown, it should be understood that other components may be mounted on (or attached to) the second substrate 50, such as integrated circuits, as well as other active and passive components.

Figure 23:
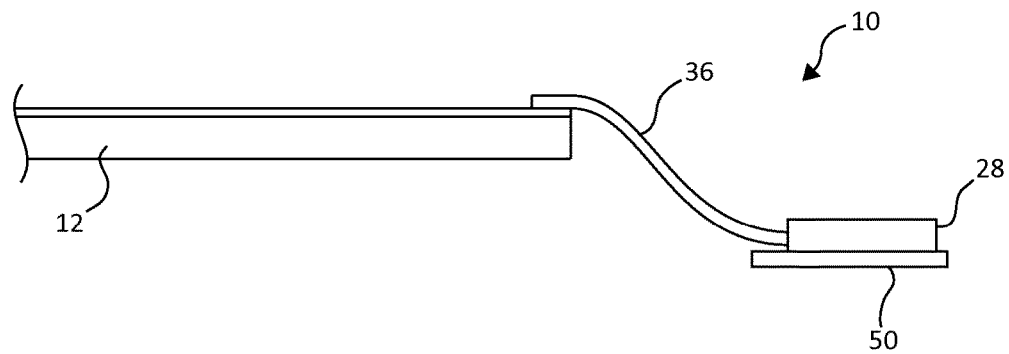
FIGS. 23-25 are side views of the touch sensor array of FIG. 22.
Figure 24:
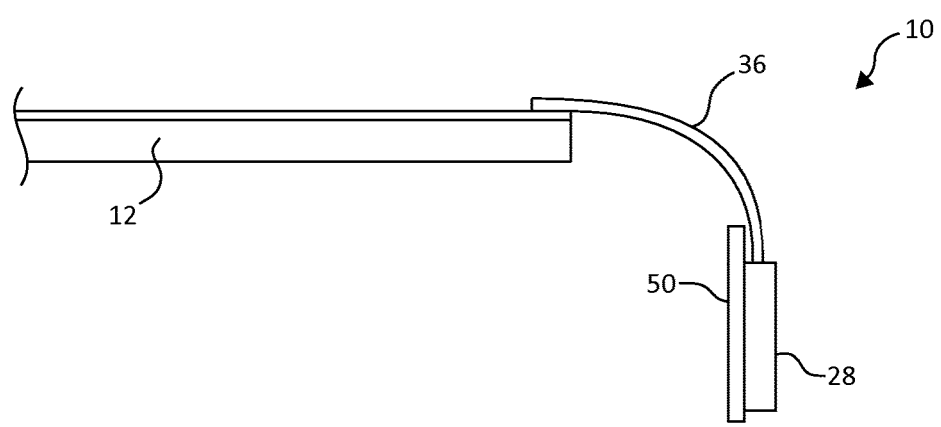
Figure 25:
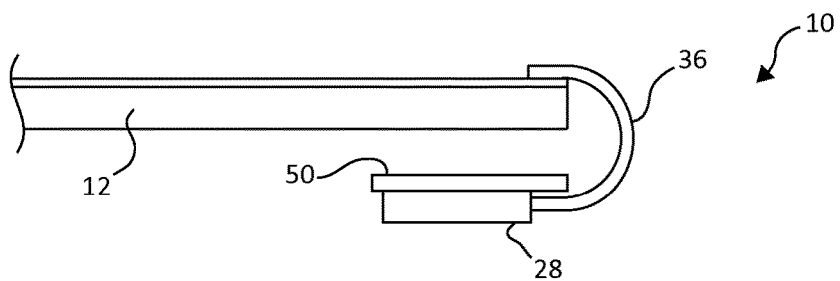
Figure 26:
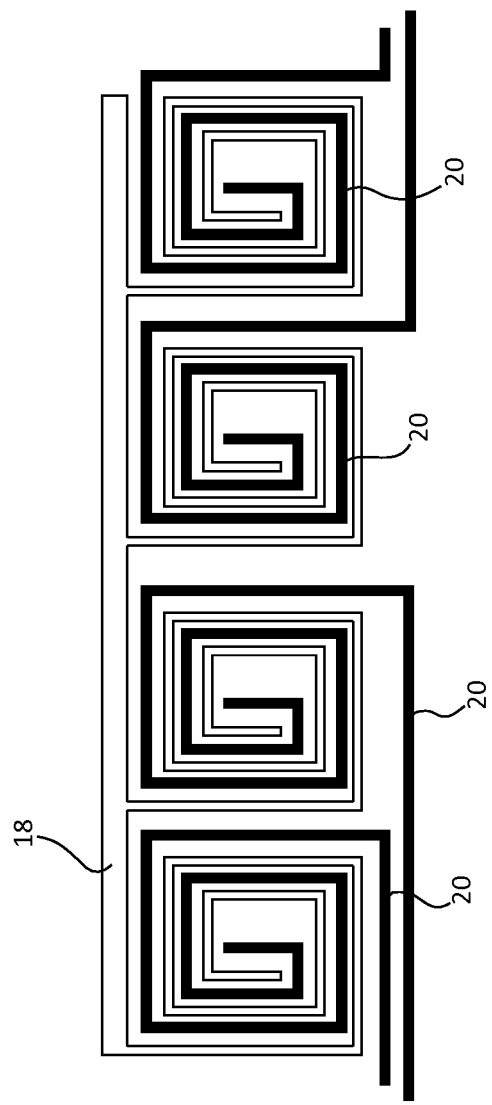
FIGS. 26-30 are plan views illustrating sensor electrodes according to various alternative embodiments.
Figure 27:
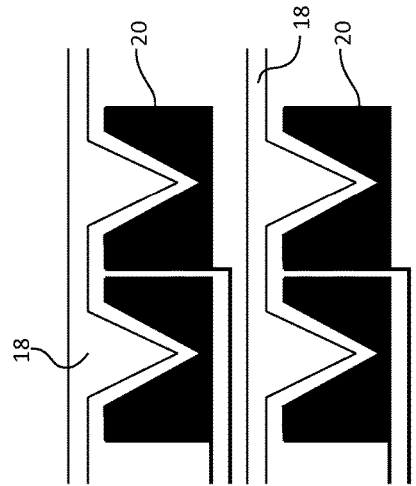
Figure 28:
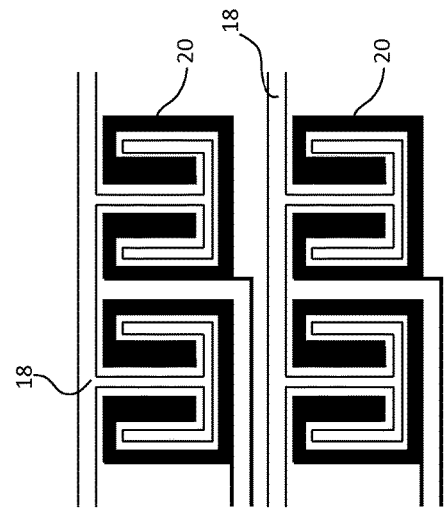
Figure 29:
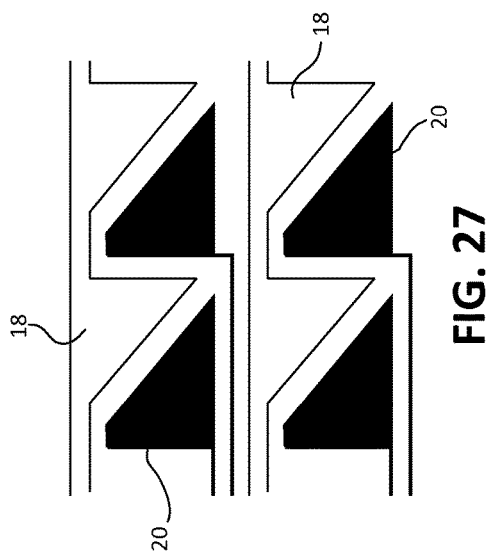
Figure 30:
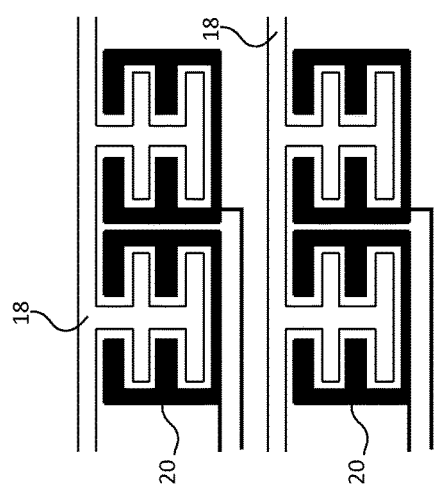

Furthermore, because of the flexible nature of the FPC 36 (i.e., in contrast to the rigid material of the first and second substrates, such as glass and a printed circuit board, respectively), the second substrate 50 may be mounted in various orientations and/or positions relative to the first substrate 12. Examples of such orientations and/or positions are illustrated in FIGS. 23-25.

FIGS. 26-30 illustrate alternative shapes and arrangements of the first electrodes 18 and the second electrodes 20, according to various embodiments of the present invention. For example, the embodiment shown in FIG. 26 includes a first electrode 18 and second electrodes 20 that include intertwined "spiral" structures, as opposed to the "comb" and "E" shaped structures previously discussed. However, it should be understood that other shapes and arrangements may be used, as shown by the various embodiments illustrated in FIGS. 27-30.

In other embodiments, different materials may be used to form the electrodes, such as copper, aluminum, silver, or any suitable conductive material that may be appropriately patterned. Furthermore, an FPC may be used to form the electrodes. In such an embodiment, the various conductive layers in the FPC may be appropriately configured to form the array of electrodes as described above, as well as to form the primary traces. As such, it should be understood that the electrodes, the traces, and the insulating material (or body) may all be formed by a single, appropriately configured FPC. As will be appreciated by one skilled in the art, such embodiments may be particularly applicable to non-transparent devices, such as mouse pads, track pads, touch pads, etc. Additionally, in other embodiments, the substrate may be made of other materials, such as any suitable plastic, including vinyl and polyamide, which may not be transparent, depending on the particular device.

In other embodiments, the sensor may be formed by laying out the sensor electrodes using alternative conductive materials such as metal mesh. In this embodiment, the electrodes are formed by disposing metal mesh electrodes on PET substrate. In an alternative embodiment, the metal mesh electrodes may be disposed on glass substrate. In another embodiment, the electrodes may be formed with silver nano-wires on PET or silver nano-wire on glass substrate.

In another embodiment, the sensor may be formed by bonding a glass (or other transparent insulating) lens onto another glass with the sensor pattern disposed on. In yet another embodiment, the sensor may be formed by bonding glass (or other transparent insulating material) onto a sheet of PET containing the sensor pattern.

As such, embodiments described herein provide a capacitive sensor device with a single layer structure in the active portion of the device, while a multi-layer structure is used in the bezel (or other non-sensing) portions for routing the traces. The multi-layer routing allows the repeated use of the traces so that the device uses the absolute minimum number of traces, and the minimum number of pins on the electronic system which drives the device.

With respect to the embodiments described above, the gap between the rows 22 (e.g., FIG. 3) is determined by the maximum number of primary traces 26 extending into the bezel portion(s) 16.

As will be appreciated by one skilled in the art, it is preferable to minimize the gap size by minimizing the trace widths and the space between the traces. The minimum trace width may be determined by the resistance of the traces and the limits of the process used to form the traces. The width of traces made of ITO may be minimized by lowering the sheet resistance of the ITO. In some embodiments, in order to avoid cross coupling between the first and second electrodes of the neighboring rows (or columns), a ground trace may be formed, which would increase the minimum gap size.

However, when the substrate is glass, rather than PET, lower sheet resistance of ITO and better trace width and spacing may be achieved, which leads to reducing the gap size between the neighboring electrodes.

Further, the pitch size (i.e., the distance between the centers of the two neighboring sensor cells or electrodes) may be adjusted by varying the pad size (i.e. the width of one of the second electrodes 20). However, it may be preferable to use a pitch of 6 mm or less.

Figure 31:
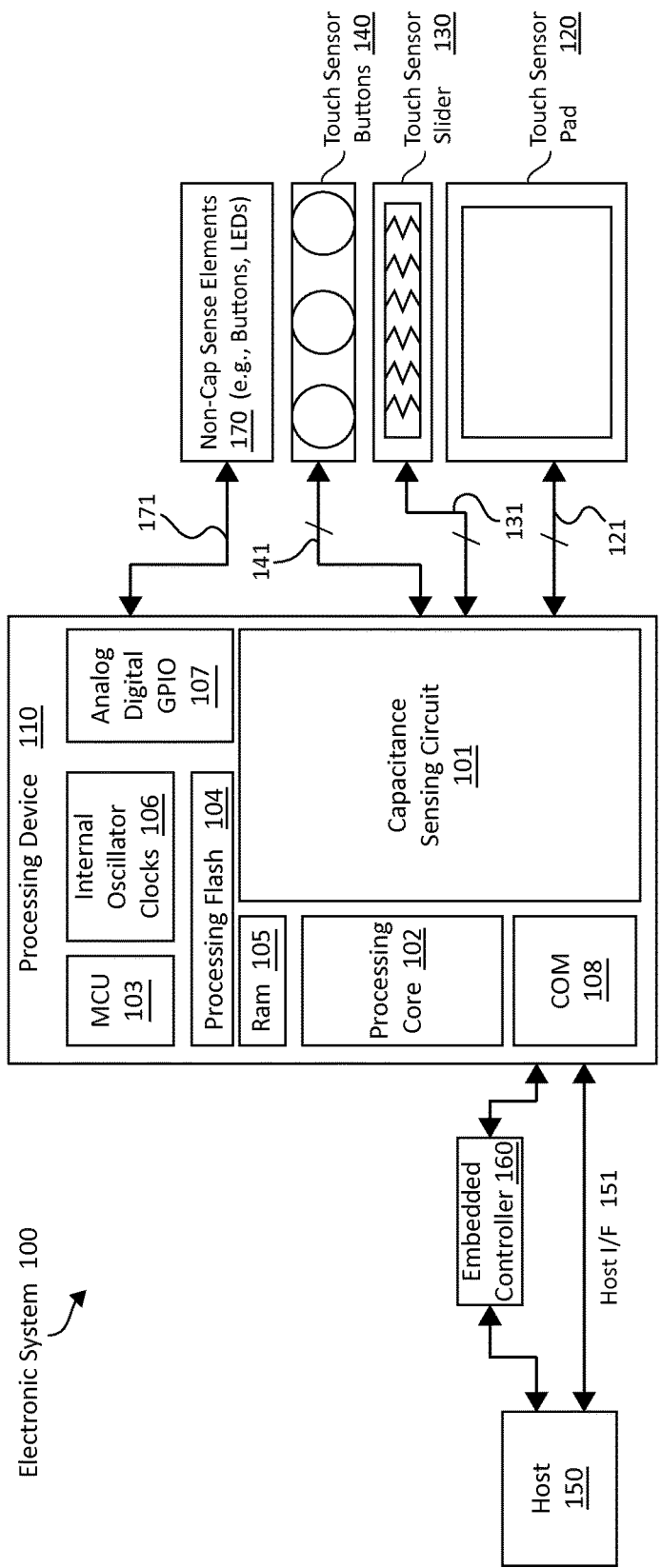
FIG. 31 is a block diagram illustrating an embodiment of an electronic system.

FIG. 31 illustrates a block diagram of one embodiment of an electronic system having a processing device for detecting a presence of a conductive object according to an embodiment of the present invention. The electronic system 100 includes a processing device 110, a touch-sensor pad 120, a touch-sensor slider 130, touch-sensor buttons 140, a host processor 150, an embedded controller 160, and non-capacitance sensor elements 170. The processing device 110 may include analog and/or digital general purpose input/output ("GPIO") ports 107. The GPIO ports 107 may be programmable and may be coupled to a Programmable Interconnect and Logic ("PIL"), which acts as an interconnect between the GPIO ports 107 and a digital block array of the processing device 110. The processing device 110 may also include memory, such as random access memory ("RAM") 105 and program flash 104. The RAM 105 may be static RAM ("SRAM"), and the program flash 104 may be a non-volatile storage, which may be used to store firmware (e.g., control algorithms executable by processing core 102 to implement operations described herein). The processing device 110 may also include a memory controller unit ("MCU") 103 coupled to memory and the processing core 102.

The processing device 110 may also include one or more analog blocks array coupled to the system bus. The analog blocks array also may be configured to implement a variety of analog circuits (e.g., ADCs, DACs, analog filters, etc.). The analog block array may also be coupled to the GPIO 107.

As illustrated, the capacitance sensing circuit 101 may be integrated into the processing device 110. The capacitance sensing circuit 101 may include analog I/O for coupling to an external component, such as the touch-sensor pad 120, the touch-sensor slider 130, the touch-sensor buttons 140, and/or other devices. The capacitance sensing circuit 101 and the processing device 110 are described in more detail below.

The embodiments described herein are not limited to touch-sensor pads for notebook implementations, but can be used in other capacitive sensing implementations, for example, the sensing device may be a touch screen, a touch-sensor slider 130, or touch-sensor buttons 140 (e.g., capacitance sensing buttons). In one embodiment, these sensing devices may include one or more capacitive sensors. The operations described herein are not limited to tablet computers, smartphones, touchscreen phone handsets, mobile internet devices (MIDs), GPS navigation devices, electronic books, notebook pointer operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc) handwriting recognition and numeric keypad operation.

In one embodiment, the electronic system 100 includes a touch-sensor pad 120 coupled to the processing device 110 via bus 121. The touch-sensor pad 120 may include a multi-dimension sensor array. The multi-dimension sensor array includes multiple sensor elements, organized as rows and columns, such as the sensor arrays described above and shown in, for example, FIGS. 3, 5, and 13. In another embodiment, the electronic system 100 includes a touch-sensor slider 130 coupled to the processing device 110 via bus 131. The touch-sensor slider 130 may include a single-dimension sensor array. The single-dimension sensor array includes multiple sensor elements, organized as rows, or alternatively, as columns. In another embodiment, the electronic system 100 includes touch-sensor buttons 140 coupled to the processing device 110 via bus 141. The touch-sensor buttons 140 may include a single-dimension or multi-dimension sensor array. The single- or multi-dimension sensor array may include multiple sensor elements. For a touch-sensor button, the sensor elements may be coupled together to detect a presence of a conductive object over the entire surface of the sensing device. Alternatively, the touch-sensor buttons 140 may have a single sensor element to detect the presence of the conductive object. In one embodiment, the touch-sensor buttons 140 may include a capacitive sensor element. The capacitive sensor elements may be used as non-contact sensor elements. These sensor elements, when protected by an insulating layer, offer resistance to severe environments.

The electronic system 100 may include any combination of one or more of the touch-sensor pad 120, the touch-sensor slider 130, and/or the touch-sensor button 140. In another embodiment, the electronic system 100 may also include non-capacitance sensor elements 170 coupled to the processing device 110 via bus 171. The non-capacitance sensor elements 170 may include buttons, light emitting diodes ("LEDs"), and other user interface devices, such as a mouse, a keyboard, or other functional keys that do not require capacitance sensing. In one embodiment, buses 171, 141, 131, and 121 may be a single bus. Alternatively, these buses may be configured into any combination of one or more separate buses.

The processing device 110 may include internal oscillator/clocks 106 and a communication block ("COM") 108. The oscillator/clocks 106 provides clock signals to one or more of the components of the processing device 110. The communication block 108 may be used to communicate with an external component, such as a host processor 150, via host interface ("I/F") line 151, using signaling protocols such as, but not limited to I2C, SPI or USB. Alternatively, the processing block 110 may also be coupled to embedded controller 160 to communicate with the external components, such as host 150. In one embodiment, the processing device 110 is configured to communicate with the embedded controller 160 or the host 150 to send and/or receive data.

The processing device 110 may reside on a common carrier substrate such as, for example, an integrated circuit ("IC") die substrate, a multi-chip module substrate, or the like. Alternatively, the components of the processing device 110 may be one or more separate integrated circuits and/or discrete components. In one exemplary embodiment, the processing device 110 may be a Programmable System on a Chip ("PSoC™") processing device, manufactured by Cypress Semiconductor Corporation, San Jose, Calif. Alternatively, the processing device 110 may be one or more other processing devices known by those of ordinary skill in the art, such as a microcontroller, a microprocessor or central processing unit, a controller, a special-purpose processor, a digital signal processor ("DSP"), an application specific integrated circuit ("ASIC"), a field programmable gate array ("FPGA"), or the like.

It should also be noted that the embodiments described herein are not limited to having a configuration of a processing device coupled to a host, but may include a system that measures the capacitance on the sensing device and sends the raw data to a host computer where it is analyzed by an application. In effect the processing that is done by processing device 110 may also be done in the host.

The capacitance sensing circuit 101 may be integrated into the IC of the processing device 110, or alternatively, in a separate IC. Alternatively, descriptions of the capacitance sensing circuit 101 may be generated and compiled for incorporation into other integrated circuits. For example, behavioral level code describing the capacitance sensing circuit 101, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe the capacitance sensing circuit 101.

It should be noted that the components of the electronic system 100 may include all the components described above. Alternatively, the electronic system 100 may include only some of the components described above.

In one embodiment, the electronic system 100 may be used in a notebook computer. Alternatively, the electronic system 100 may be used in other applications, such as a mobile handset, a personal data assistant ("PDA"), a keyboard, a television, a remote control, a monitor, a handheld multi-media device, a handheld video player, a handheld gaming device, or a control panel.

The conductive object in this case is a finger, alternatively, this technique may be applied to any conductive object, for example, a conductive door switch, position sensor, or conductive pen in a stylus tracking system.

Although the foregoing examples have been described in some detail for purposes of clarity of understanding, the invention is not limited to the details provided. There are many alternative ways of implementing the invention. The disclosed examples are illustrative and not restrictive.

Thus, in one embodiment, a capacitance sensing device is provided. The capacitance sensing device includes a substrate having a central portion and an outer portion. A plurality of substantially co-planar electrodes are on the central portion substrate. A first plurality of conductors are on the substrate. Each of the first plurality of conductors has a first end portion electrically connected to one of the plurality of electrodes and a second end portion on the outer portion of the substrate. An insulating material is coupled to the second end portions of the first plurality of conductors. A second plurality of conductors is coupled to the insulating material. The second plurality of conductors and the insulating material are configured such that each of the second plurality of conductors is electrically connected to the second end portion of at least some of the first plurality of conductors and is insulated from the second end portion of the others of the first plurality of conductors.

In another embodiment, a capacitance sensing device is provided. The capacitance sensing device includes a substrate having a central portion and an outer portion. A first set of electrodes is formed on the central portion substrate. A second set of electrodes is formed on the central portion of the substrate. The second set of electrodes is arranged in a series of rows and is substantially co-planar with the first set of electrodes. A first plurality of conductors are formed on the substrate. Each of the first plurality of conductors has a first end portion electrically connected to one of the first set of electrodes and a second end portion on the outer portion of the substrate. A second plurality of conductors are formed on the substrate. Each of the second plurality of conductors has a first end portion electrically connected to one of the second set of electrodes and a second end portion on the outer portion of the substrate. An insulating body is coupled to the second end portion of each of the first plurality of conductors and the second end portion of each of the second plurality of conductors. A third plurality of conductors is coupled to the insulating body such that each is electrically connected to one of the second end portion of one of the first plurality of conductors and the second end portion of the second plurality of conductors associated with only one row of the second set of electrodes and is electrically insulated from the second end portion of the others of the first set of conductors and the second end portion of the second plurality of conductors associated with the other rows of the second set of electrodes.

In a further embodiment, a capacitance sensing device is provided. The capacitance sensing device includes a substrate having a central portion and an outer portion. A first set of electrodes is formed on the central portion substrate.

A second set of electrodes is formed on the central portion of the substrate. The second set of electrodes is arranged in a series of rows and substantially co-planar with the first set of electrodes. A first plurality of conductors are on the substrate. Each of the first plurality of conductors has a first end portion electrically connected to one electrode of the first set of electrodes or the second set of electrodes and a second end portion on the outer portion of the substrate. A second plurality of conductors is coupled to the substrate. Each of the second plurality of conductors is electrically connected to at least one of the first plurality of conductors at a node that is external to the central portion of the substrate such that each of the second plurality of conductors is electrically connected to one electrode of the first set of electrodes or a plurality of electrodes in one of the rows of the second set of electrodes.

In a further embodiment, a method for constructing a capacitance sensing device is provided. A plurality of electrodes are formed on a central portion of a substrate. The substrate has a central portion and an outer portion. A first plurality of conductors are formed on the substrate. Each of the first plurality of conductors is connected to and extends from at least one of the plurality of electrodes. An insulating material is formed on the outer portion of the substrate and at least partially over some of the first plurality of conductors. A second plurality of conductors are formed on the insulating material, wherein the second plurality of conductors and the insulating material are configured such that each of the second plurality of conductors is electrically connected to at least some of the first plurality of conductors and is insulated from the others of the first plurality of conductors.

In a further embodiment, a method for constructing a capacitance sensing device is provided. A plurality of substantially co-planar electrodes are formed on the central portion of the substrate. A first plurality of conductors are formed on the substrate. Each of the first plurality of conductors has a first end electrically connected to one of the plurality of electrodes and a second end portion on the outer portion of the substrate. An insulating body is attached to the outer portion of the substrate adjacent to the second end portions of the first plurality of conductors. Each of a second plurality of conductors on the insulating body is electrically connected to the second end portion of at least some of the first plurality of conductors. Each of the second plurality of conductors is insulated from the second end portion of the others of the first plurality of conductors by the insulating body.

In a further embodiment, a method for constructing a capacitance sensing device is provided. A substrate having a central portion and an outer portion is provided. A plurality of substantially co-planar electrodes is formed over the central portion substrate. A first plurality of traces are formed over the substrate. Each of the first plurality of traces have a first end portion electrically connected to one of the plurality of electrodes and a second end portion over the outer portion of the substrate. An insulating body is formed over the outer portion of the substrate. The insulating body has a first width at a first portion thereof and a second width at a second portion thereof. The first width is greater than the second width. A second plurality of traces are formed over the outer portion of the substrate. The first plurality of traces, the second plurality of traces, and the insulating material are arranged such that each of the second plurality of traces is electrically connected to at least some of the first plurality of traces and is insulated from the others of the first plurality of traces.

In a further embodiment, a capacitance sensing device is provided. The capacitance sensing device includes a substrate having a central portion, a first outer portion, and a second outer portion. The first outer portion and the second outer portion are on opposing sides of the central portion. A plurality of substantially co-planar electrodes are on the central portion substrate. A first plurality of conductors are on the substrate. Each of the first plurality of conductors having a first end portion electrically connected to one of the plurality of electrodes and a second end portion on the first outer portion or the second outer portion of the substrate. A first insulating body is coupled to the first outer portion of the substrate. A second insulating body is coupled to the second outer portion of the substrate. A second plurality of conductors are included. Each of the second plurality of conductors is coupled to the first insulating body or the second insulating body. The second plurality of conductors, the first insulating body, and the second insulating body are configured such that each of the second plurality of conductors is electrically connected to the second end portion of at least some of the first plurality of conductors on the respective outer portion of the substrate and is insulated from the others of the first plurality of conductors by the respective insulating body.

In a further embodiment, a capacitance sensing device is provided. The capacitance sensing device includes a first substrate having a central portion and an outer portion. A plurality of substantially co-planar electrodes are on the central portion of the first substrate. A first plurality of conductors are on the substrate. Each of the first plurality of conductors has a first end portion electrically connected to one of the plurality of electrodes and a second end portion on the outer portion of the first substrate. A second substrate is also included. A second plurality of conductors are connected to the second substrate. At least one insulating body is coupled to the first substrate and the second substrate, wherein the second plurality of conductors and the at least one insulating body are configured such that each of the second plurality of conductors is electrically connected to at least some of the first plurality of conductors and is insulated from the others of the first plurality of conductors.

In a further embodiment, a method for constructing a capacitance sensing device is provided. A substrate having a central portion, a first outer portion, and a second outer portion is provided. The first outer portion and the second outer portion are on opposing sides of the central portion. A plurality of substantially co-planar electrodes are formed on the central portion substrate. A first plurality of conductors are formed on the substrate. Each of the first plurality of conductors has a first end portion electrically connected to one of the plurality of electrodes and a second end portion on the one of first outer portion and the second outer portion of the substrate that is closer to the respective one of the plurality of electrodes. A first insulating body is attached to the first outer portion of the substrate. A second insulating body is attached to the second outer portion of the substrate. Each of a second plurality of conductors on the first insulating body and the second insulating body are electrically connected to the second end portion of at least some of the first plurality of conductors on the respective outer portion of the substrate. Each of the second plurality of conductors is insulated from the others of the first plurality of conductors by the respective insulating body.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A capacitance sensing device comprising:
   a plurality of electrodes disposed on a central portion of a substrate;
   a first plurality of conductors disposed on the substrate in a first direction, each of the first plurality of conductors having a first end portion electrically connected to one of the plurality of electrodes and a second end portion that extends into an outer portion of the substrate, wherein the first end portions and the second end portions of the first plurality of conductors are made of a first conductive material, have substantially the same thickness, and lay in substantially the same plane;
   a second plurality of conductors disposed on the outer portion of the substrate in a second direction different from the first direction, wherein:
      each of the second plurality of conductors passes over one or more of the first plurality of conductors,
      the second plurality of conductors are made of a second conductive material distinct from the first conductive material, and
      the respective second end portion of each of the first plurality of conductors includes a respective extension disposed in the second direction, the respective extension forming an electrical connection with a respective one of the second plurality of conductors; and
   a single dielectric layer disposed above the first plurality of conductors in the outer portion of the substrate, selectively insulating the first plurality of conductors from the second plurality of conductors, wherein the single dielectric layer is an island that has a polygonal shape without holes whose width varies according to a corresponding distance from the central portion of the substrate and for each respective conductor of the first plurality of conductors:
      the single dielectric layer is not disposed over a respective portion of the respective conductor where a respective corresponding conductor of the second plurality of conductors passes over the respective conductor, thereby creating an electrical connection between the respective conductor and the respective corresponding conductor without a conductive via; and
      the single dielectric layer insulates the respective conductor from the other conductors in the second plurality of conductors in areas where the other conductors pass over the respective conductor.

2. The capacitance sensing device of claim 1, wherein the first plurality of conductors fan out at different angles on the outer portion of the substrate.

3. The capacitance sensing device of claim 1, wherein the single dielectric layer is one of a plurality of dielectric layers disposed on the outer portion of the substrate.

4. The capacitance sensing device of claim 1, wherein the plurality of electrodes comprises a first set of electrodes and a second set of electrodes, wherein the second set of electrodes is arranged in a series of rows.

5. The capacitance sensing device of claim 4, wherein the first plurality of conductors comprises a first set of traces and a second set of traces, wherein the first end portion of each of the first set of traces is electrically connected to one of the first set of electrodes and the first end portion of each of the second set of traces is electrically connected to one of the second set of electrodes.

6. The capacitance sensing device of claim 4, wherein each of the first set of electrodes substantially extends across the central portion of the substrate, and wherein the rows of the second set of electrodes extend perpendicular relative to the first set of electrodes.

7. The capacitance sensing device of claim 4, wherein each of the plurality of electrodes includes two or more comb members, and the comb members of the first set of electrodes and the second set of electrodes are interleaved with each other.

8. The capacitance sensing device of claim 4, wherein each of the first set of electrodes is interleaved with two or more of the second set of electrodes that are arranged in a column.

9. The capacitance sensing device of claim 4, wherein the first set of electrodes includes a plurality of transmitter electrodes, and the second set of electrodes includes a plurality of receiver electrodes.

10. The capacitance sensing device of claim 1, wherein the width of the polygonal shape decreases according to distance from the central portion of the substrate.

11. The capacitance sensing device of claim 1, wherein the single dielectric layer has a stair-like shape.

12. The capacitance sensing device of claim 1, wherein the plurality of electrodes further comprises:
   a first set of electrodes, wherein the second end portions of the first set of electrodes extend into a first side of the outer portion; and
   a second set of electrodes, wherein the second end portions of the second set of electrodes extend into a second side of the outer portion opposing the first side of the outer portion.

* * * * *